(12) United States Patent
Ohmi et al.

(10) Patent No.: US 8,362,567 B2
(45) Date of Patent: Jan. 29, 2013

(54) SEMICONDUCTOR DEVICE

(75) Inventors: Tadahiro Ohmi, Miyagi (JP); Akinobu Teramoto, Miyagi (JP); Rihito Kuroda, Miyagi (JP)

(73) Assignees: National University Corporation Tohoku University, Sendai-shi (JP); Foundation for Advancement of International Science, Tsukuba-shi (JP)

( * ) Notice: Subject to any disclaimer, the term of this patent is extended or adjusted under 35 U.S.C. 154(b) by 740 days.

(21) Appl. No.: 12/309,245

(22) PCT Filed: Jul. 12, 2007

(86) PCT No.: PCT/JP2007/063926
§ 371 (c)(1), (2), (4) Date: Nov. 20, 2009

(87) PCT Pub. No.: WO2008/007748
PCT Pub. Date: Jan. 17, 2008

(65) Prior Publication Data
US 2010/0059830 A1    Mar. 11, 2010

(30) Foreign Application Priority Data

Jul. 13, 2006  (JP) .................................. 2006-192440

(51) Int. Cl.
*H01L 21/70*        (2006.01)
(52) U.S. Cl. .................. 257/368; 257/64; 257/E29.004; 257/E29.116
(58) Field of Classification Search .................. None
See application file for complete search history.

(56) References Cited

U.S. PATENT DOCUMENTS

| | | | |
|---|---|---|---|
| 7,189,648 B2 | 3/2007 | Lander et al. | |
| 7,928,518 B2 | 4/2011 | Ohmi et al. | |
| 2003/0020143 A1* | 1/2003 | Shimizu et al. | 257/627 |
| 2004/0033681 A1 | 2/2004 | Ahn et al. | |
| 2004/0266076 A1 | 12/2004 | Doris et al. | |
| 2005/0036382 A1* | 2/2005 | Kato | 365/222 |
| 2006/0017110 A1 | 1/2006 | Adetutu et al. | |

(Continued)

FOREIGN PATENT DOCUMENTS

| | | |
|---|---|---|
| EP | 0 926 713 A2 | 6/1999 |
| EP | 1635385 A1 | 3/2006 |

(Continued)

OTHER PUBLICATIONS

Seong Dong Kim et al.; Advanced Model and Analysis for Series Resistance in Sub-100nm CMOS Including Poly Depletion and Overlap Doping Gradient Effect; 2000, pp. 723-726.

(Continued)

*Primary Examiner* — Benjamin Sandvik
*Assistant Examiner* — Leslie Pilar Cruz
(74) *Attorney, Agent, or Firm* — Foley & Lardner LLP

(57) ABSTRACT

In a semiconductor device, the degree of flatness of 0.3 nm or less in terms of a peak-to-valley (P-V) value is realized by rinsing a silicon surface with hydrogen-added ultrapure water in a light-screened state and in a nitrogen atmosphere and a contact resistance of $10^{-11}$ $\Omega\text{cm}^2$ or less is realized by setting a work function difference of 0.2 eV or less between an electrode and the silicon. Thus, the semiconductor device can operate on a frequency of 10 GHz or higher.

20 Claims, 34 Drawing Sheets

U.S. PATENT DOCUMENTS

| | | | |
|---|---|---|---|
| 2006/0038229 A1* | 2/2006 | Tsuchiya et al. | 257/351 |
| 2006/0071291 A1 | 4/2006 | Yagishita | |

FOREIGN PATENT DOCUMENTS

| | | |
|---|---|---|
| JP | 04-372166 | 12/1992 |
| JP | 09-051097 | 2/1997 |
| JP | 2004-152965 A | 5/2004 |
| JP | 2004-200672 A | 7/2004 |
| JP | 2004-356114 A | 12/2004 |
| JP | 2005-123626 A | 5/2005 |
| WO | WO 2007/063963 A1 | 6/2007 |
| WO | WO 2007/072844 A1 | 6/2007 |

OTHER PUBLICATIONS

European Patent office European search report on application No. 10007624.9 dated Sep. 3, 2010; 6 pages.

Arima et al., "Hydrogen termination of Si(110) surface upon wet cleaning revealed by highly resolved scanning tunneling microscopy", *Journal of Applied Physics*, vol. 98, No. 10, Nov. 2005, pp. 103525-1-103525-8.

Gaubert et al., "I/f Noise Suppression of pMOSFETs Fabricated on Si(100) and Si(110) Using an Alkali-Free Cleaning Process" *IEEE Transactions on Electron Devices*, vol. 53, No. 4, Apr. 2006, pp. 851-856.

Morita et al., "Atomic scale flattening and hydrogen termination of the Si(001) surface by wet-chemical treatment", *Journal of Vacuum Science and Technology*, vol. 14, No. 3, May 1996, pp. 854-858.

Tanaka et al., "A Technology for Reducing Flicker Noise for ULSI Applications", *Japan Soc. Appl. Phys.*, Apr. 2003, pp. 2106-2109.

Wilk et al., In situ Si flux cleaning technique for producinig atomically flat Si(100) surfaces at low temperature, *Appl. Phys. Lett.*, vol. 70, No. 17, Apr. 1997, pp. 2288-2290.

Yamanaka et al., "Correlation Between Inversion Layer Mobility and Surface Roughness Measured by AFM", *IEEE Electron Device Letters*, vol. 17, No. 4, Apr. 1996, pp. 178-180.

Office Action for Japanese Application No. 2008-524843 issued May 16, 2012 with English translation; 5 pages.

Schmidt M. et al.: "Nickel-silicide process for ultra-thin body SOI-MOSFETs", Microelectronic Engineering, Elsevier Publishers BV., Amsterdam, NL, vol. 82, No. 3-4, Dec. 1, 2005; pp. 497-502.

Ohmi T. et al.: "Revolutional Progress of Silicon Technologies Exhibiting Very High Speed Performance Over a 50-GHz Clock Rate", IEEE Transactions on Electron Devices, IEEE Service Center, Piscataway, NJ, US, vol. 54, No. 6, Jun. 1, 2007; pp. 1471-1477.

Weitao Cheng et al.: "Impact of Improved High-Performance Si(110)-Oriented Metal-Oxide-Semiconductor Field-Effect Transistors Using Accumulation-Mode Fully Depleted Silicon-on-Insulator Devies", Japanese Journal of Applied Physics, vol. 45, No. 4B, Apr. 25, 2006, pp. 3110-3116.

European Office Action for EP No. 07790720.2-2203 issued Jun. 12, 2012; 7 pages.

Extended European Search Report for EP No. 12150918.6-2203 issued Jun. 13, 2012; 7 pages.

Extended European Search Report for EP No. 12150923.6-2203 issued Jun. 13, 2012; 9 pages.

\* cited by examiner (100) 4° Offset Plane

Side view  Step down→
←— 20 Å —→

(551) Plane [(110) 8° Offset Plane]

| | Device Structure | Operating Speed Limit |
|---|---|---|
| Planar MOS | Conventional (100)-Plane CMOS | 5 GHz Clock FIG. 12(b) |
| | (100)-Plane Unbalanced CMOS (Inversion Mode) | 10 GHz Clock FIG. 12(c) |
| | (100)-Plane Unbalanced CMOS (Accumulation Mode: SOI) | 20 GHz Clock |
| | (551)-Plane Unbalanced CMOS (Inversion Mode) | 20 GHz Clock FIG. 12(d) |
| | (551)-Plane Unbalanced CMOS (Accumulation Mode) | 40 GHz Clock |
| 3-Dimensional MOS | Balanced CMOS (Inversion Mode) | 30 GHz Clock FIG. 12(e) |
| | Balanced CMOS (Accumulation Mode: SOI) | 60 GHz Clock |

FIG. 13A

NOR

NAND

L=45[nm]
(Leff=29[nm])
Inversion:1.0V
Accumulation:1.3V

SEMICONDUCTOR DEVICE

This application is the National Phase of PCT/JP2007/063926, filed Jul. 12, 2007, which claims priority to Japanese Application No. 2006-192440, filed Jul. 13, 2006. The contents of the foregoing applications are incorporated by reference in their entirety.

TECHNICAL FIELD

This invention relates to a MOS-type semiconductor device that is widely used in an IC, an LSI, or the like and, in particular, relates to a high-speed semiconductor device.

BACKGROUND ART

Since the appearance of semiconductor devices, one of themes for which technical efforts have been most focused on semiconductor devices is to increase the operating frequency (clock frequency). As the operable frequency of transistors has increased to enable high-speed operations, the application range thereof has also expanded so that the transistors have contributed to the realization of the current broadband-network society and to the IT development. The operating frequency of semiconductor devices has been increased year by year to reach the range of GHz, while, in recent years, the speed of the improvement has been slowed down. In the current state, the operating frequency is staying at 3 to 4 GHz and there is a demand for early realization of a semiconductor device that can operate at a clock frequency of 10 GHz or more. One of factors related to the increase in operating frequency of a semiconductor device is the size. As the size decreases, the capacitance decreases and thus the transmission speed of signals (the signal transmission speed) increases.

As is well known, in recent years, the speed of miniaturization of semiconductor devices has been slowed down, which has been a factor of impeding the improvement in operating frequency. Assuming that the size of a semiconductor element is reduced to its limit and is constant, a factor for increasing the operating frequency is an operating current of the element. With a MOSFET as an example, one of factors that determine the operating frequency is how much drain current is allowed to flow depending on a gate voltage when the drain voltage is set constant. As the drain current increases, the charge/discharge time of the output capacitance decreases and thus the signal transmission speed to the next stage increases. However, if the size of the element is reduced to its limit, it is difficult to increase the drain current in the present state of art, which impedes the improvement in operating frequency.

As described above, even if it is attempted to set the operating frequency of a semiconductor device to, for example, about 10 GHz or more, it is difficult to increase the drain current in the case of a transistor reduced in size to its limit. In view of this, it has hitherto been considered impossible to realize a high-speed semiconductor device that can operate at about 10 GHz or more, preferably at about 20 GHz or more, and further even at 40 to 60 GHz.

DISCLOSURE OF THE INVENTION

It is an object of this invention to obtain a high-speed semiconductor device that can operate at a clock frequency of about 10 GHz or more.

It is also an object of this invention to obtain a high-speed semiconductor device that can operate at a clock frequency of about 20 GHz or more.

It is also an object of this invention to obtain a high-speed semiconductor device that can operate at a clock frequency of about 30 GHz or more.

It is also an object of this invention to obtain a high-speed semiconductor device that can operate at a clock frequency of about 40 GHz or more.

It is also an object of this invention to obtain a high-speed semiconductor device that can operate even at a clock frequency of about 60 GHz.

It is also an object of this invention to provide a high-speed MOS transistor that can increase a drain current obtained for a constant drain voltage and gate voltage.

Hereinbelow, aspects of this invention will be enumerated.

[First Aspect]

A semiconductor device characterized in that a flatness degree of a surface of a channel region in terms of a peak-to-valley value over a length of 2 nm in a direction from a source to a drain is 0.3 nm or less.

[Second Aspect]

In the semiconductor device according to the first aspect, the flatness degree of the surface of the channel region in terms of the peak-to-valley value over the length of 2 nm in the direction from the source to the drain is 0.16 nm or less.

[Third Aspect]

In the semiconductor device according to the first or second aspect, the semiconductor device comprises a source region and a drain region at both ends of the channel region and an electrode electrically connected to at least one of the source region and the drain region. A resistance from the electrode to the channel region is 1.50Ω·μm or less.

[Fourth Aspect]

A semiconductor device comprises a channel region, a source region and a drain region at both ends of the channel region, and an electrode electrically connected to at least one of the source region and the drain region. A resistance from the electrode to the channel region is 4 Ω·μm or less.

[Fifth Aspect]

In the semiconductor device according to the fourth aspect, the resistance is 1 Ω·μm or less.

[Sixth Aspect]

In the semiconductor device according to the fourth aspect, the resistance includes a contact resistance of a contact portion where the electrode is in contact with the at least one of the source region and the drain region, and an internal series resistance of the at least one of the source region and the drain region from the contact portion to the channel region, and the contact resistance is $1 \times 10^{-10}$ Ωcm$^2$ or less.

[Seventh Aspect]

In the semiconductor device according to the sixth aspect, at least the contact portion of the electrode is formed of a metal silicide and a metal forming the metal silicide is selected in such a manner that a work function difference between the metal silicide and the one of the source region and the drain region becomes about 0.32 eV or less.

[Eighth Aspect]

In a semiconductor device comprising at least a pair of an n-channel transistor and a p-channel transistor, at least contact portions of first electrodes respectively contacting source and drain regions of the n-channel transistor are formed of a first metal silicide and at least contact portions of second electrodes respectively contacting source and drain regions of the p-channel transistor are formed of a second metal silicide different from the first metal silicide.

[Ninth Aspect]

In the semiconductor device according to the eighth aspect, the first metal silicide is formed of a material that has a work function thereof to be −4.37 eV or more and the second metal silicide is formed of a material that has a work function of −4.85 eV or less.

[Tenth Aspect]

In the semiconductor device according to the eighth or ninth aspect, a surface of a channel region of each of the n-channel transistor and the p-channel transistor has a flatness degree of 0.3 nm or less in terms of a peak-to-valley value over a length of 2 nm in a direction from a source to a drain of each corresponding transistor.

[Eleventh Aspect]

In the semiconductor device according to the first or fourth aspect, the source region and the drain region are formed of a metal or a metal-semiconductor compound having a work function with a difference of 0.32 eV or less with respect to a work function of a semiconductor of the channel region.

[Twelfth Aspect]

In the semiconductor device according to the eleventh aspect, the channel region is formed of n-type silicon and the source region and the drain region are formed of a metal or a metal silicide having a work function of −4.37 eV or more.

[Thirteenth Aspect]

In the semiconductor device according to the eleventh aspect, the channel region is formed of p-type silicon and the source region and the drain region are formed of a metal or a metal silicide having a work function of −4.85 eV or less.

[Fourteenth Aspect]

In the semiconductor device according to any one of the first, fourth, and eighth aspects, the semiconductor device includes an n-channel transistor and at least a part of a surface of a channel region of the n-channel transistor has a (100) plane or a plane within ±10° from the (100) plane.

[Fifteenth Aspect]

In the semiconductor device according to any one of the first, fourth, and eighth aspects, the semiconductor device includes a p-channel transistor and at least a part of a surface of a channel region of the p-channel transistor has a (110) plane or a plane within ±10° from the (110) plane.

[Sixteenth Aspect]

In the semiconductor device according to the eighth or ninth aspect, at least a part of a surface of a channel region of the n-channel transistor has at least one of a (100) plane or a plane within ±10° from the (100) plane and a (110) plane or a plane within ±10° from the (110) plane and at least a part of a surface of a channel region of the p-channel transistor has at least one of a (110) plane or a plane within ±10° from the (110) plane and a (100) plane or a plane within ±10° from the (100) plane.

[Seventeenth Aspect]

A semiconductor device comprises a circuit having at least a pair of transistors of different conductivity types. The semiconductor device further comprises an n-channel transistor having a first semiconductor layer and a first gate insulating layer covering at least a part of a surface of the first semiconductor layer, and a p-channel transistor having a second semiconductor layer and a second gate insulating layer covering at least a part of a surface of the second semiconductor layer. A surface of a first region, adapted to form a channel, of the first semiconductor layer has at least one of a (100) plane or a plane within ±10° from the (100) plane and a (110) plane or a plane within ±10° from the (110) plane. A surface of a second region, adapted to form a channel, of the second semiconductor layer has at least one of a (110) plane or a plane within ±10° from the (110) plane and a (100) plane or a plane within ±10° from the (100) plane. The surface of each of the first region and the second region has a flatness degree such that a peak-to-valley over a length of 2 nm in a direction from a source to a drain of the corresponding region is 0.3 nm or less.

[Eighteenth Aspect]

In the semiconductor device according to the seventeenth aspect, the flatness degree is set to 0.16 nm or less.

[Nineteenth Aspect]

In the semiconductor device according to the seventeenth or eighteenth aspect, the semiconductor device comprises, at both ends of each of the first and second regions each adapted to form the channel, a source region and a drain region and further a source electrode and a drain electrode. A resistance from each of the electrodes to the corresponding region adapted to form the channel is set to 1.50 Ω·μm or less.

[Twentieth Aspect]

A semiconductor device comprises a circuit having at least a pair of transistors of different conductivity types. The semiconductor device further comprises an n-channel transistor having a first semiconductor layer and a first gate insulating layer covering at least a part of a surface of the first semiconductor layer, and a p-channel transistor having a second semiconductor layer and a second gate insulating layer covering at least a part of a surface of the second semiconductor layer. A surface of a first region, adapted to form a channel, of the first semiconductor layer has at least one of a (100) plane or a plane within ±10° from the (100) plane and a (110) plane or a plane within ±10° from the (110) plane. A surface of a second region, adapted to form a channel, of the second semiconductor layer has at least one of a (110) plane or a plane within ±10° from the (110) plane and a (100) plane or a plane within ±10° from the (100) plane. A source region and a drain region and further a source electrode and a drain electrode are provided at both ends of each of the first region and the second region. A resistance from each of the first and second regions to each of the source electrode and the drain electrode provided at both ends of the corresponding region is set to 4 Ω·μm or less.

[Twenty-First Aspect]

In the semiconductor device according to the twentieth aspect, the surface of each of the first and second regions has a flatness degree of 0.3 nm or less in terms of a peak-to-valley value over a length of 2 nm in a direction from the corresponding source region to the corresponding drain region.

[Twenty-Second Aspect]

In the semiconductor device according to the seventeenth or twentieth aspect, at least contact portions, respectively contacting the source region and the drain region, of the source electrode and the drain electrode at both ends of the first region are formed of a first metal silicide and at least contact portions, respectively contacting the source region and the drain region, of the source electrode and the drain electrode at both ends of the second region are formed of a second metal silicide different from the first metal silicide.

[Twenty-Third Aspect]

In the semiconductor device according to the twenty-second aspect, the first metal silicide is formed of a material that has a work function thereof to be −4.37 eV or more and the second metal silicide is formed of a material that has a work function thereof to be −4.85 eV or less.

[Twenty-Fourth Aspect]

In the semiconductor device according to the seventeenth or twentieth aspect, the source region and the drain region at both ends of the first region are formed of a first metal or metal silicide having a work function of −4.37 eV or more and shared by at least a part of the source electrode and at least a part of the drain electrode, respectively, and the source region and the drain region at both ends of the second region are formed of a second metal or metal silicide having a work function of −4.85 eV or less and shared by at least a part of the source electrode and at least a part of the drain electrode, respectively.

[Twenty-Fifth Aspect]

In the semiconductor device according to the seventeenth or twentieth aspect, the surface of the first region, adapted to form the channel, of the first semiconductor layer and the surface of the second region, adapted to form the channel, of the second semiconductor layer are each formed by the (100) plane or the plane within ±10° from the (100) plane.

[Twenty-Sixth Aspect]

In the semiconductor device according to the seventeenth or twentieth aspect, the surface of the first region, adapted to form the channel, of the first semiconductor layer and the surface of the second region, adapted to form the channel, of the second semiconductor layer are each formed by the (110) plane or the plane within ±10° from the (110) plane.

[Twenty-Seventh Aspect]

In the semiconductor device according to the seventeenth or twentieth aspect, an upper surface of the first region of the first semiconductor layer and an upper surface of the second region of the second semiconductor layer are each formed by a (110) plane or a plane within ±10° from the (110) plane. A third region adapted to form a channel is provided on one side or both sides of the first semiconductor layer. A surface of the third region has a (100) plane or a plane within ±10° from the (100) plane. A width and a length of the upper surface of the first region, a width and a length of the upper surface of the second region, and a height and a length of the surface of the third region are determined so that the sum of an area of the upper surface of the first region and an area of the surface of the third region is substantially equal or equivalent to an area of the upper surface of the second region and, further, operating speeds of the n-channel transistor and the p-channel transistor are substantially equal or equivalent to each other.

[Twenty-Eighth Aspect]

In the semiconductor device according to any one of the eighth, seventeenth, and twentieth aspect, the n-channel transistor and the p-channel transistor are each normally off, one of the n-channel transistor and the p-channel transistor is of one of an inversion mode and an accumulation mode, and the other is of the one or the other of the inversion mode and the accumulation mode.

[Twenty-Ninth Aspect]

In the semiconductor device according to any one of the first, fourth, and eighth aspect, the semiconductor device is normally off and is of an inversion mode or an accumulation mode.

[Thirtieth Aspect]

In the semiconductor device according to any one of the first, fourth, and eighth aspect, the semiconductor device is an accumulation-mode transistor.

[Thirty-First Aspect]

In the semiconductor device according to the twenty-eighth aspect, a channel region of the accumulation-mode transistor is formed by an SOI layer and a thickness of the SOI layer is set smaller than that of a depletion layer in the vicinity of a source region of the channel region.

[Thirty-Second Aspect]

In the semiconductor device according to the thirty-first aspect, the thickness of the SOI layer, an impurity concentration in the SOI layer, and a work function of a gate electrode over the channel region are determined so that an end portion on a source region side of the channel region is filled with the depletion layer when a gate voltage is equal to a source voltage in the accumulation-mode transistor.

[Thirty-Third Aspect]

In the semiconductor device according to the first or fourth aspect, a gate insulating film on the channel region contains at least one kind of $SiO_2$, $Si_3N_4$, a metal silicon alloy oxide film, and a metal silicon alloy nitride film formed by a microwave-excited plasma.

According to this invention, there is obtained, by the above aspects, a MOS transistor (MOSFET) that can increase a drain current obtained for a constant drain voltage and gate voltage. As a result, there is obtained a high-speed semiconductor device that can operate at a clock frequency of about 10 GHz or more. Further, by applying the configuration of this invention to at least one of an optimal surface orientation, an accumulation mode, and a fully balanced CMOS structure using a three-dimensional structure, there is obtained a high-speed semiconductor device that can operate at a clock frequency of about 20 GHz or more, about 30 GHz or more, about 40 GHz or more, or even about 60 GHz.

BRIEF DESCRIPTION OF THE DRAWINGS

FIG. 13A is a diagram showing the relationship between the device structure and the operating speed.

BEST MODE FOR CARRYING OUT THE INVENTION

Figure 1A:
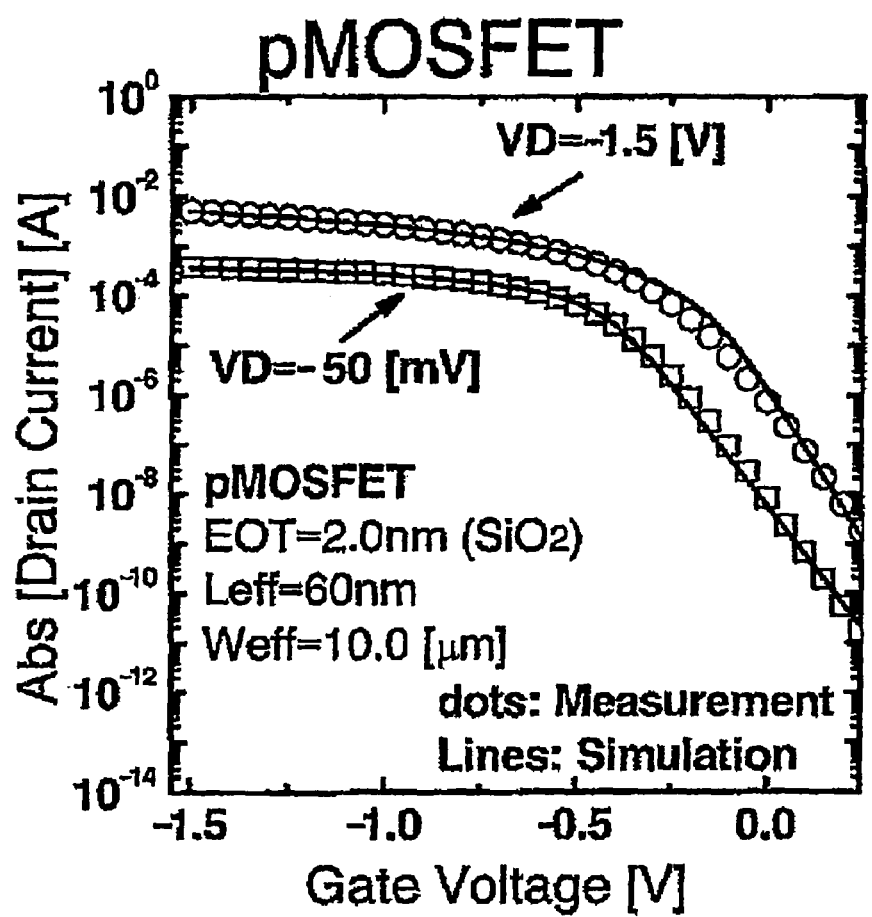
FIG. 1A is a graph showing the gate voltage VG-drain current ID characteristics of a conventional pMOSFET.
Figure 1B:
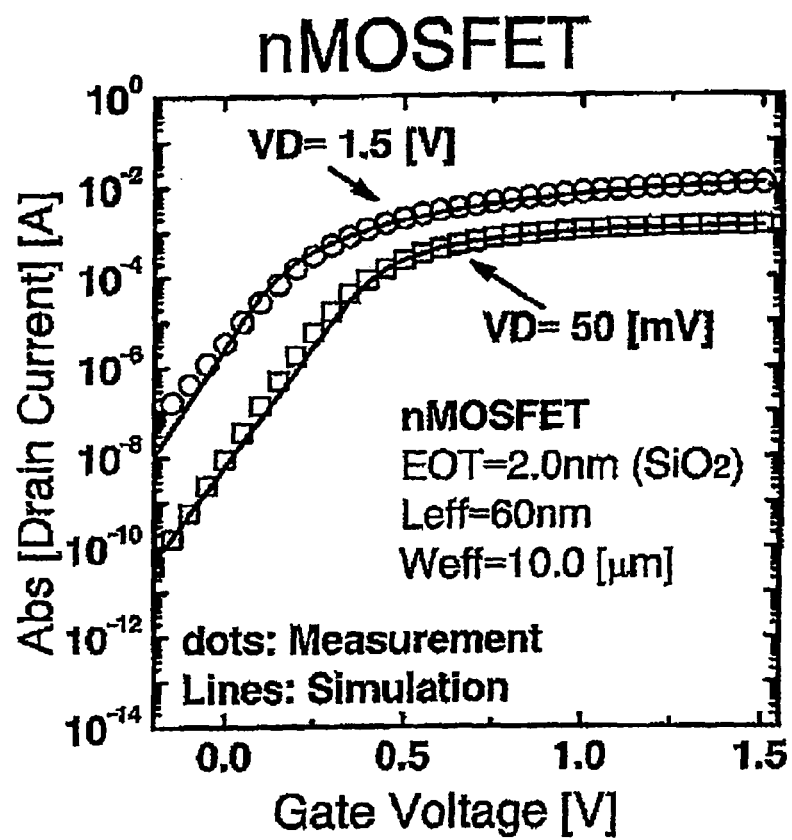
FIG. 1B is a graph showing the gate voltage VG-drain current ID characteristics of a conventional nMOSFET.

Referring to FIGS. 1A and 1B, there are shown the relationships between the gate voltage VG and the drain current ID in conventional pMOSFET and nMOSFET. In each transistor, a channel region has an effective length of 60 nm and an effective width of 10.0 μm and a gate insulating film has a thickness of 2.0 nm by EOT. FIG. 1A shows the relationships between the gate voltage VG and the drain current ID in the state where drain voltages VD of −1.5V and −50 mV are respectively applied. Likewise, FIG. 1B shows the relationships between the gate voltage and the drain current in the state where drain voltages VD of 1.5V and 50 mV are respectively applied. In these figures, the drain current ID given along the ordinate axis is expressed in absolute value. Herein, the characteristics obtained when the drain voltage VD of the absolute value 1.5V is applied are characteristics in a saturation region of each transistor, i.e. in a region where a relationship of (VG-Vth)<VD (Vth represents a threshold value) is established. On the other hand, the characteristics obtained when the drain voltage VD of the absolute value 50 mV is applied are characteristics in a linear region of each transistor, i.e. in a region where a relationship of (VG-Vth)>VD is established.

As is clear from FIGS. 1A and 1B, when the gate voltage VG approaches 0V, the drain current ID decreases to $10^{-6}$ A or less. Herein, given that the gate voltage VG when the drain current ID is $10^{-6}$ A is a threshold voltage Vth, the threshold voltages Vth in FIGS. 1A and 1B are −0.372V and 0.379V, respectively. This means that a large drain current ID cannot be obtained with a low power supply voltage and, as a result, a gate insulating film cannot be thinned. Further, even if the absolute value of the gate voltage VG is increased, the drain current ID is saturated from $10^{-3}$ A (linear region) to $10^{-2}$ A (saturation region) and cannot be further increased. Therefore, using the conventional nMOSFET or pMOSFET, a reduction in power consumption or an increase in speed/performance cannot be expected. Specifically, the clock frequency is limited to about 2 to 3 GHz and thus it is not possible to obtain a MOSFET that operates at a clock frequency of 10 GHz or more.

Figure 2:
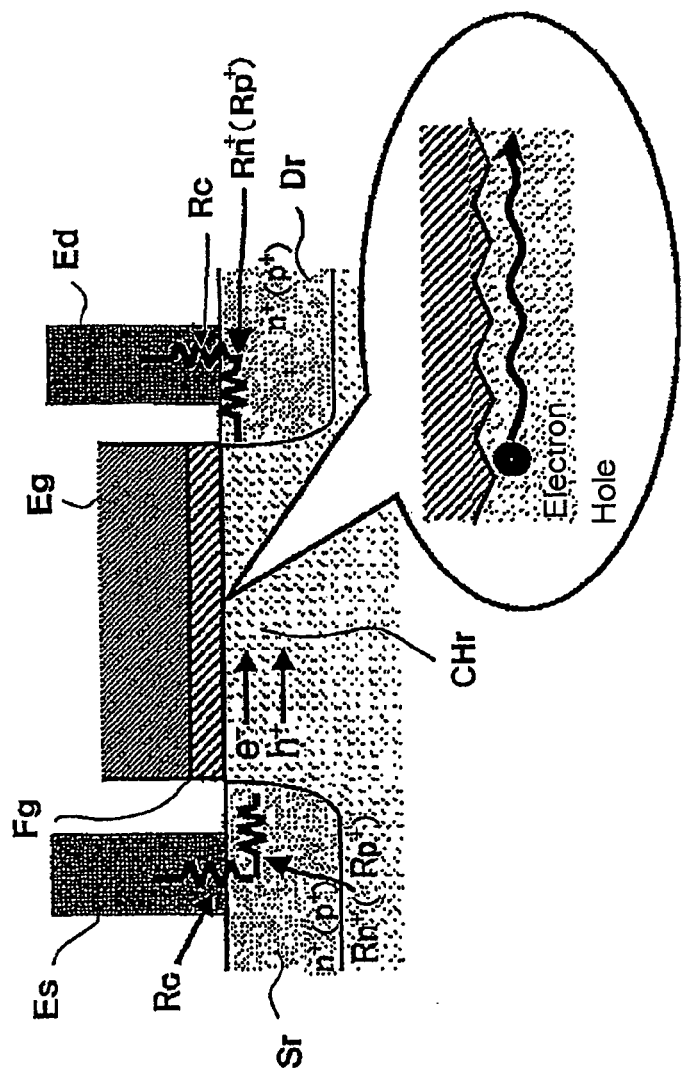
FIG. 2 is a diagram exemplarily illustrating the structure of a conventional MOSFET.

Referring to FIG. 2, the structure of a conventional MOSFET is schematically and exemplarily illustrated. The MOSFET illustrated in FIG. 2 comprises a channel region CHr, a source region Sr and a drain region Dr provided on both sides of the channel region CHr so as to sandwich it therebetween, a gate insulating film Fg provided on the surface of the channel region CHr, and a gate electrode Eg formed on the gate insulating film Fg. A source electrode Es and a drain electrode Ed are provided on the surfaces of the source region Sr and the drain region Dr, respectively.

The surface of the channel region CHr in the illustrated conventional MOSFET, i.e. the interface between the channel region CHr and the gate insulating film Fg, is not flat at the atomic level, but has an irregular shape with peaks and valleys as enlargedly and exemplarily illustrating a central portion of the channel region in FIG. 2. A peak-to-valley value (which may be referred to as a "flatness degree" in this invention described hereinafter) over a length of 2 nm in a direction from the source to the drain is about 1.5 nm in each of the transistors shown in FIGS. 1A and 1B. Therefore, electrons or holes serving as carriers move zigzag in the channel region CHr along the interface between the channel region CHr and the gate insulating film Fg and are thus largely affected by interface scattering. The mobility of carriers increases as phonon scattering, Coulomb scattering, and interface scattering respectively decrease. The phonon scattering and the Coulomb scattering can be reduced by optimizing the surface orientation of the channel surface {i.e. (100) plane or the like in nMOSFET and (110) plane or (551) plane in pMOSFET}, but it has conventionally been considered impossible to reduce the interface scattering.

In the illustrated example, a contact resistance between the source electrode Es and the source region Sr is given by Rc and a source region internal resistance between the source region Sr and the channel region CHr is given by $Rn^+$ (or $Rp^+$). This is the same between the drain region Dr and the drain electrode Ed and between the drain region Dr and the channel region CHr.

Given that the intrinsic transconductance of the MOSFET illustrated in FIG. 2 is gmi, the intrinsic transconductance gmi can be expressed by the following formula (1).

$$gmi=(\mu_{eff} \times W)(Vg-Vth)/(L \times Tox/\epsilon ox) \quad (1)$$

where μeff represents an effective mobility, W is a channel width, L is a channel length, Tox is an effective thickness of the gate insulting film, and εox is a permittivity of the gate insulating film.

On the other hand, given that, as illustrated in FIG. 2, the sum of the contact resistance Rc and the region resistance $Rn^+$ (or $Rp^+$) is a series resistance Rs, an effective transconductance gmeff of the MOSFET illustrated in FIG. 2 can be expressed by the following formula (2).

$$gmeff=gmi/(1+Rs \cdot gmi) \quad (2)$$

Therefore, it is seen that, in order to increase the effective transconductance gmeff, it is necessary to reduce the series resistance Rs as much as possible, not to mention to increase the intrinsic transconductance gmi.

Given that the capacitance between the source and drain in a CMOS circuit (see FIG. 12A) including the MOSFET illustrated in the figure is CL, an operation delay time τ in the CMOS circuit can be expressed by the following formula (3).

$$\tau=CL/gmeff=CL(1+Rs \cdot gmi)/gmi \quad (3)$$

From the formula (3), it is seen that the speedup of the MOSFET can be achieved by increasing the intrinsic transconductance gmi and reducing the capacitance CL between the source and drain and the series resistance Rs.

On the other hand, the effective mobility μeff given in the formula (1) can be expressed by the following formula (4).

$$(1/\mu_{eff})=(1/\mu c)+(1/\mu p)+(1/\mu r) \quad (4)$$

where μc represents a mobility of carriers in the channel region by Coulomb scattering, μp is that by phonon scattering, and μr is that by interface scattering.

From the formula (1), the intrinsic transconductance gmi can be increased by increasing the effective mobility μeff and, for increasing the intrinsic transconductance gmi, the mobility μr of carriers in the channel region may be increased.

According to the study by the present inventors, it has been found that μr can be increased by flattening the surface of the channel region, i.e. the interface between the channel region and the gate insulating film, at the atomic level. Particularly, it has been found that if a flatness degree of 0.3 nm or less in terms of a peak-to-valley (P-V) value is obtained, the effective mobility μeff of the MOSFET can be largely improved.

In each of the transistors whose characteristics are shown in FIGS. 1A and 1B, the contact resistance Rc is about $1 \times 10^{-8}$ $\Omega cm^2$ and, as a result, the series resistance Rs is about 100 $\Omega \cdot \mu m$.

In this invention, it has also been found that if the contact resistance can be reduced to about $1 \times 10^{-10}$ $\Omega cm^2$ or less, preferably $1 \times 10^{-11}$ $\Omega cm^2$ or less, it is possible to increase the effective transconductance gmeff. Conventionally, in the series resistance Rs, the contact resistance Rc is too large and thus the influence of the region resistance $Rn^+$ (or $Rp^+$) has been small enough to be ignorable as compared with that of the contact resistance. However, in this invention, since the contact resistance Rc is reduced, the influence of the region resistance $Rn^+$ (or $Rp^+$) cannot be ignored and it has also been found that the effective transconductance gmeff of the MOSFET can be dramatically improved by setting the region resistance to 4 $\Omega \cdot \mu m$ or less, preferably 1.50 $\Omega \cdot \mu m$ or less, and further preferably 1 $\Omega \cdot \mu m$ or less.

Figure 3:
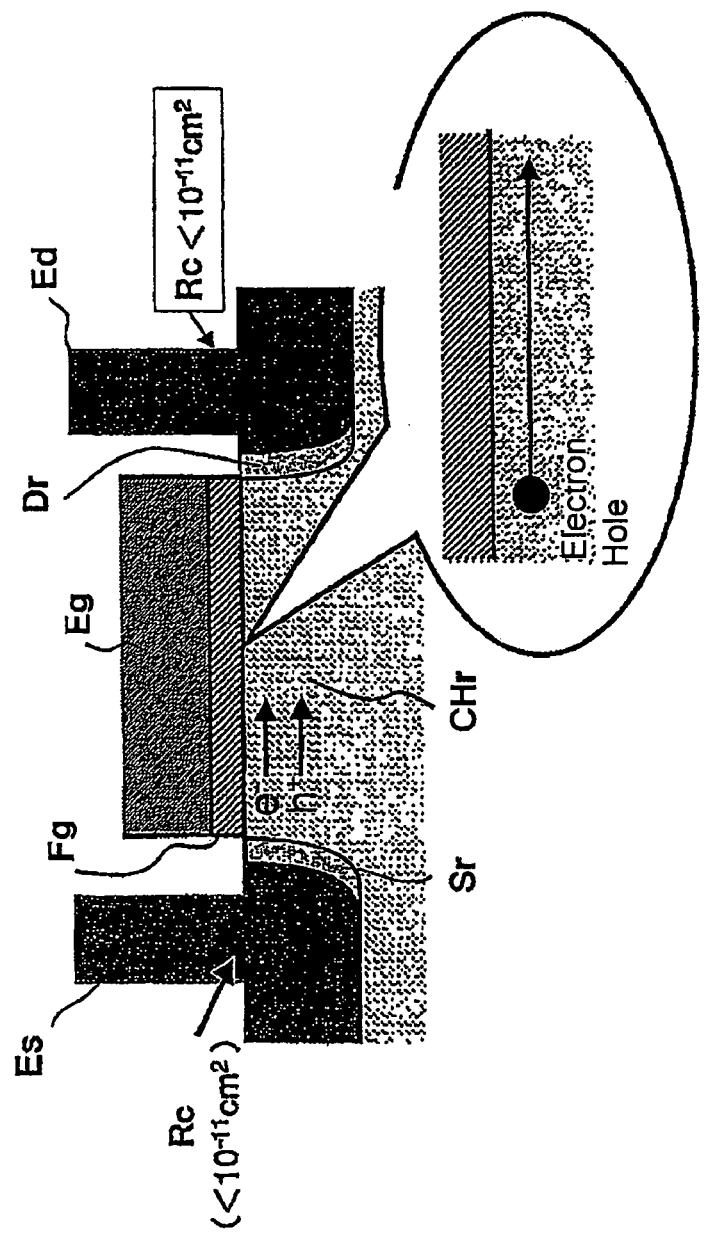
FIG. 3 is a diagram illustrating a schematic structure of a MOSFET according to this invention.

Referring to FIG. 3, a description will be given of a theoretical structure of a high-speed semiconductor device according to this invention on the basis of the above knowledge. That is, in FIG. 3, the interlace between a channel region CHr and a gate insulating film Fg is flat at the atomic level, i.e. has a flatness degree of 0.3 nm or less, preferably 0.16 nm or less. In a MOSFET having such a structure, carriers (electrons or holes) can linearly flow without being affected by interface scattering of the surface of the channel region. Therefore, as described with reference to FIG. 2, the mobility of carriers significantly increases as compared with the case where carriers flow zigzag.

Further, the electrode structure illustrated in FIG. 3 is configured such that, by partially embedding electrode regions in a source region Sr and a drain region Dr, and so on, the length from each of electrode contacting portions of the source region Sr and the drain region Dr to the channel region CHr is minimized. By this, not only region resistances ($Rn^+$ or $Rp^+$) are each reduced, but also contact resistances Rc between the electrode and the source region and between the electrode and the drain region are each set to $10^{-11}$ $\Omega cm^2$ or less by selecting an electrode material in consideration of a work function of $n^+$ or $p^+$ silicon regions forming the source region and the drain region, as will be described hereinbelow. Accordingly, the effective transconductance gmeff can be set very large.

Figure 4A:
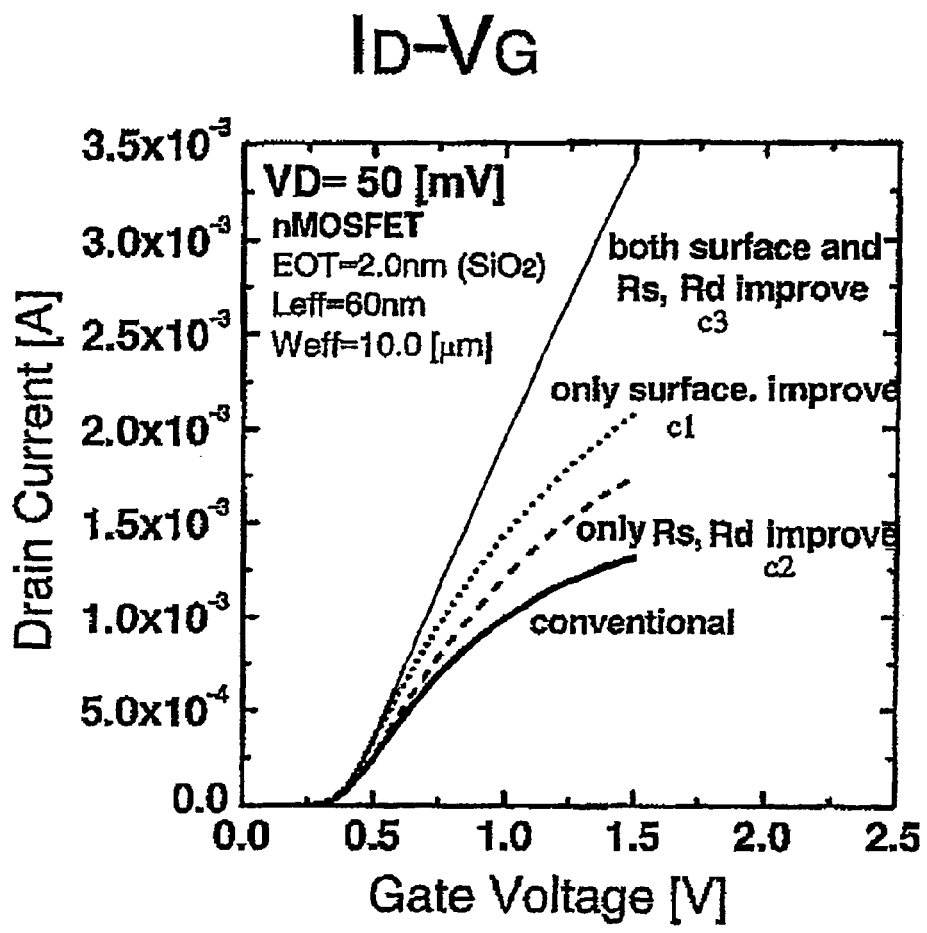
FIG. 4A is a diagram showing simulation results of the drain current ID-gate voltage VG characteristics of nMOSFETs according to this invention.
Figure 4B:
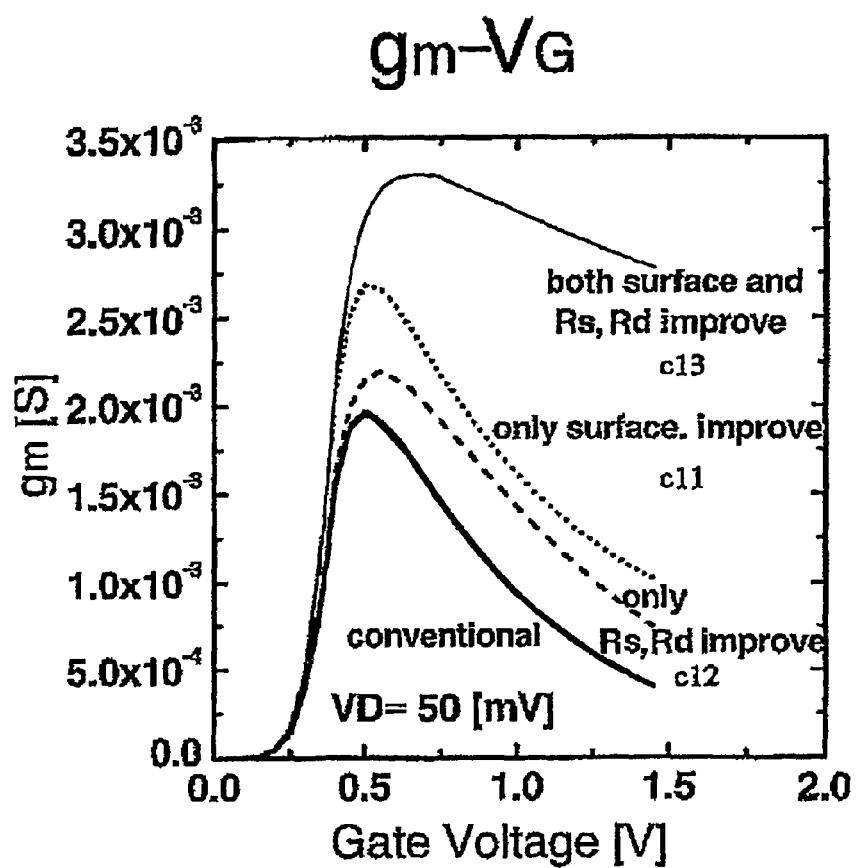
FIG. 4B is a diagram showing simulation results of the transconductance gm-gate voltage VG characteristics of nMOSFETs according to this invention.

FIGS. 4A and 4B respectively show simulation results of the drain current ID-gate voltage VG characteristics and the transconductance gm-gate voltage VG characteristics in the linear region of n-channel transistors each having the size shown in the characteristic diagram of FIG. 1B. In FIG. 4A, the conventional example (conventional) indicated by a thick solid line corresponds to the case of VD=50 mV in FIG. 1B. Note, however, that the ordinate axis is given in logarithmic scale in FIG. 1B, while, the ordinate axis is given in linear scale in FIGS. 4A, 4B, 5A, and 5B. In FIG. 4A, curve C1 represents the characteristics obtained when the flatness degree of the surface of a channel region is improved to its limit (0.13 nm in terms of P-V value) and curve C2 represents the characteristics obtained when a series resistance Rs on the source side and a series resistance Rd on the drain side are improved to zero. Both curves C1 and C2 each show that the drain current ID can be dramatically increased as compared with the characteristic curve of the conventional nMOSFET indicated by the thick solid line. Further, as shown by curve C3, when the source series resistance Rs and the drain series resistance Rd are set to substantially zero and the flatness degree of the surface of a channel region is improved to its limit, the improvement in drain current ID-gate voltage VG characteristics can be synergistically enhanced. That is, the drain current ID can be dramatically increased by at least one of the reduction in series resistance and the improvement in surface flatness degree and the effect can be synergistically enhanced by employing both of them.

Also in the transconductance gm-gate voltage VG characteristics shown in FIG. 4B, as shown by curve C11, the nMOSFET with the flatness degree of the surface of the channel region improved to its limit can dramatically increase the transconductance gm as compared with the conventional nMOSFET indicated by a thick solid line. Further, as shown by curve C12, the transconductance gm can be increased than the conventional nMOSFET by setting the series resistances Rs and Rd to substantially zero. Further, when the flatness degree and the series resistances are both reduced, the transconductance gm can be extremely increased due to the synergistic effect as shown by curve C13.

Figure 5A:
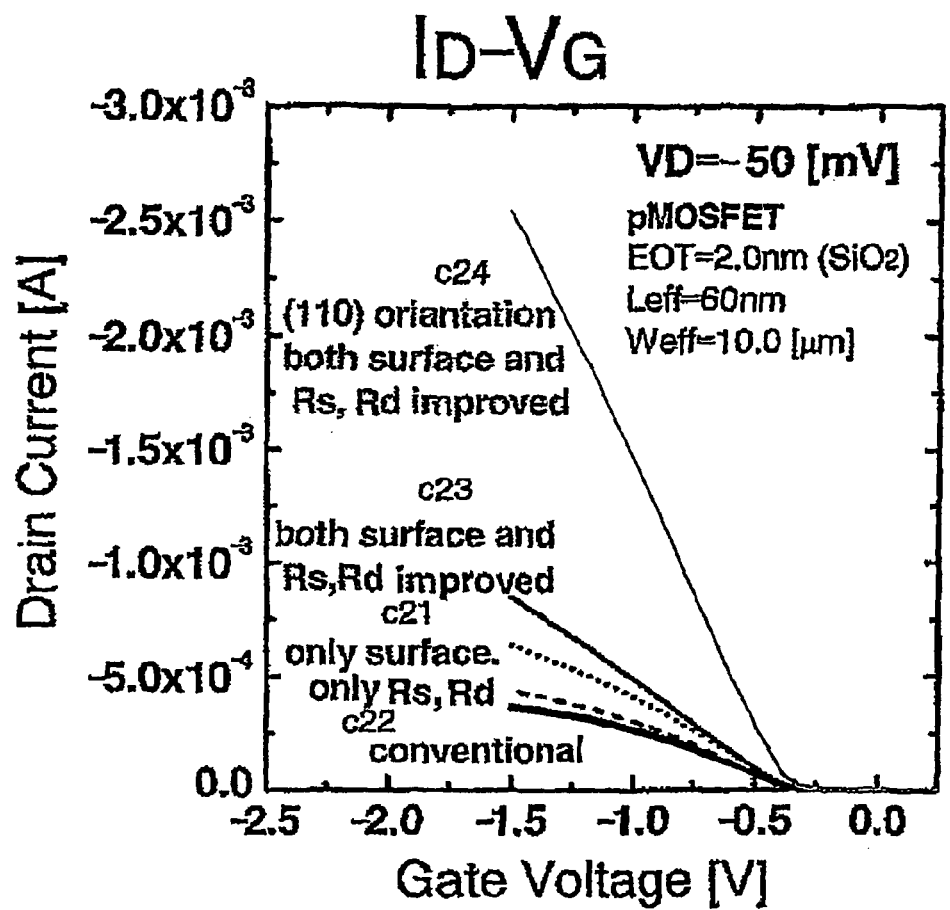
FIG. 5A is a diagram showing simulation results of the drain current ID-gate voltage VG characteristics of pMOSFETs according to this invention.
Figure 5B:
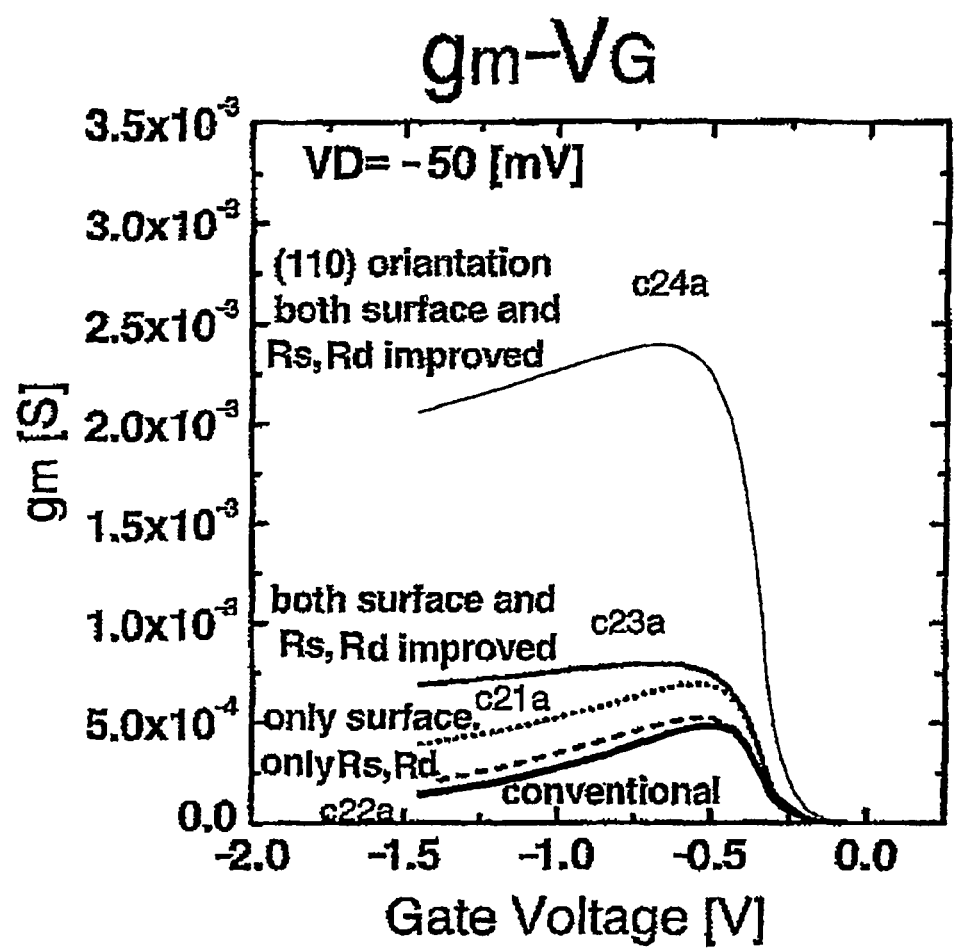
FIG. 5B is a diagram showing simulation results of the transconductance gm-gate voltage VG characteristics of pMOSFETs according to this invention.
Figure 6A:
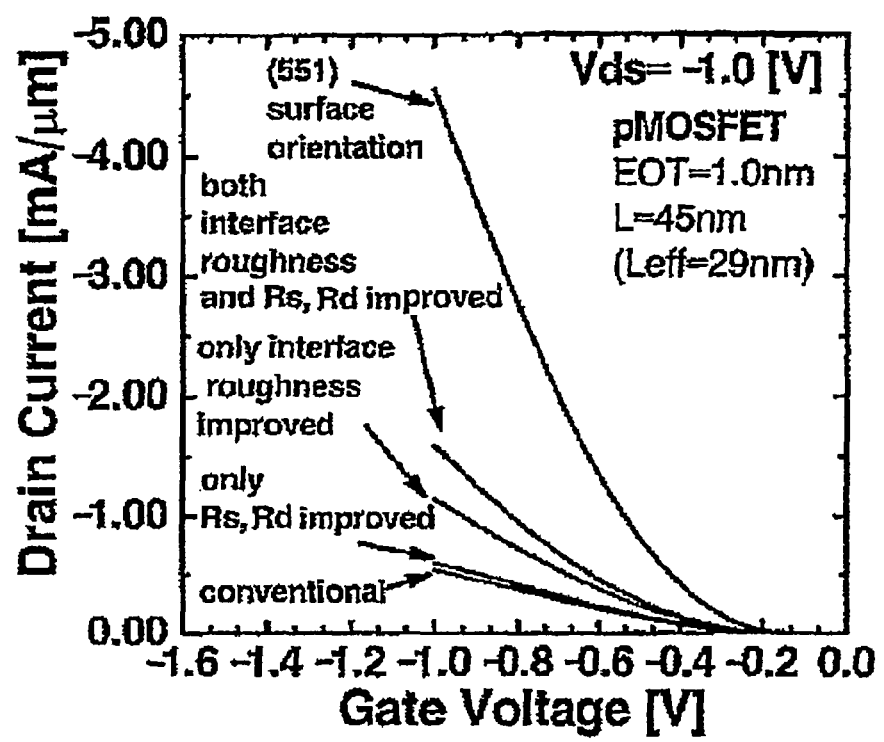
FIG. 6A is a diagram showing the ID-VG characteristics in the linear region of pMOSFETs according to this invention.
Figure 6B:
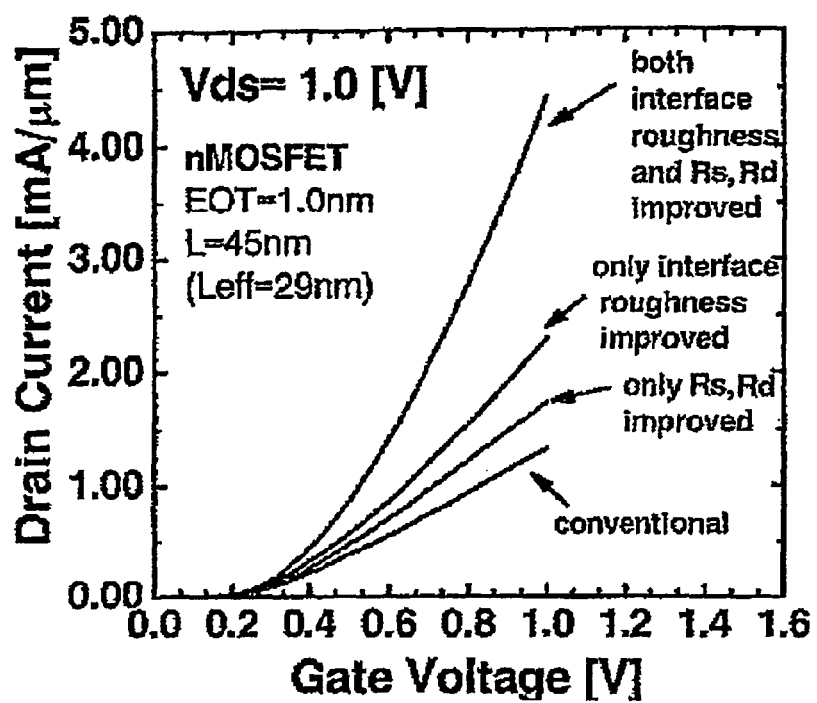
FIG. 6B is a diagram showing the ID-VG characteristics in the linear region of nMOSFETs according to this invention.
Figure 6C:
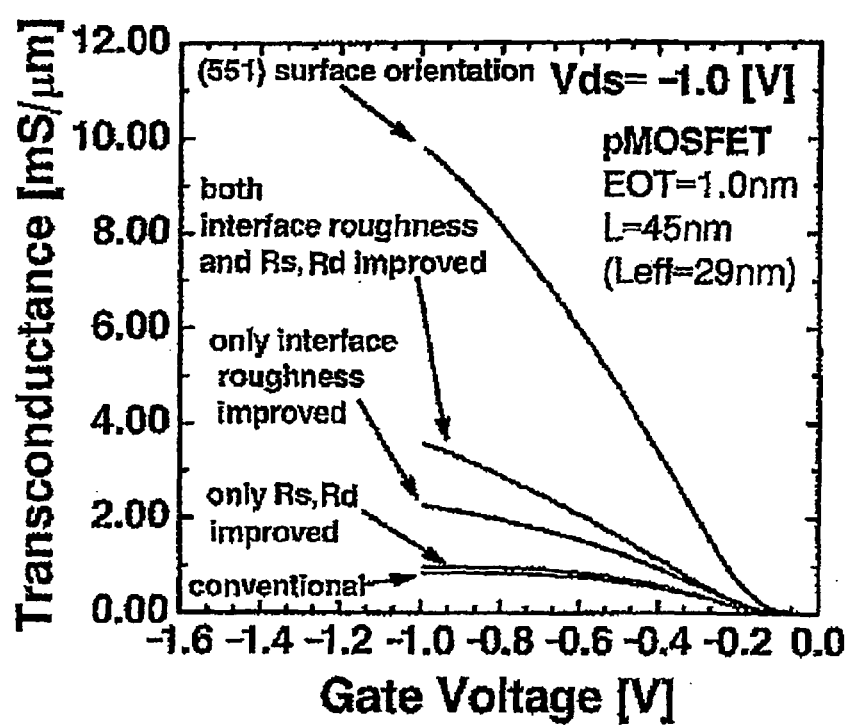
FIG. 6C is a diagram showing the gm-VG characteristics in the linear region of pMOSFETs according to this invention.
Figure 6D:
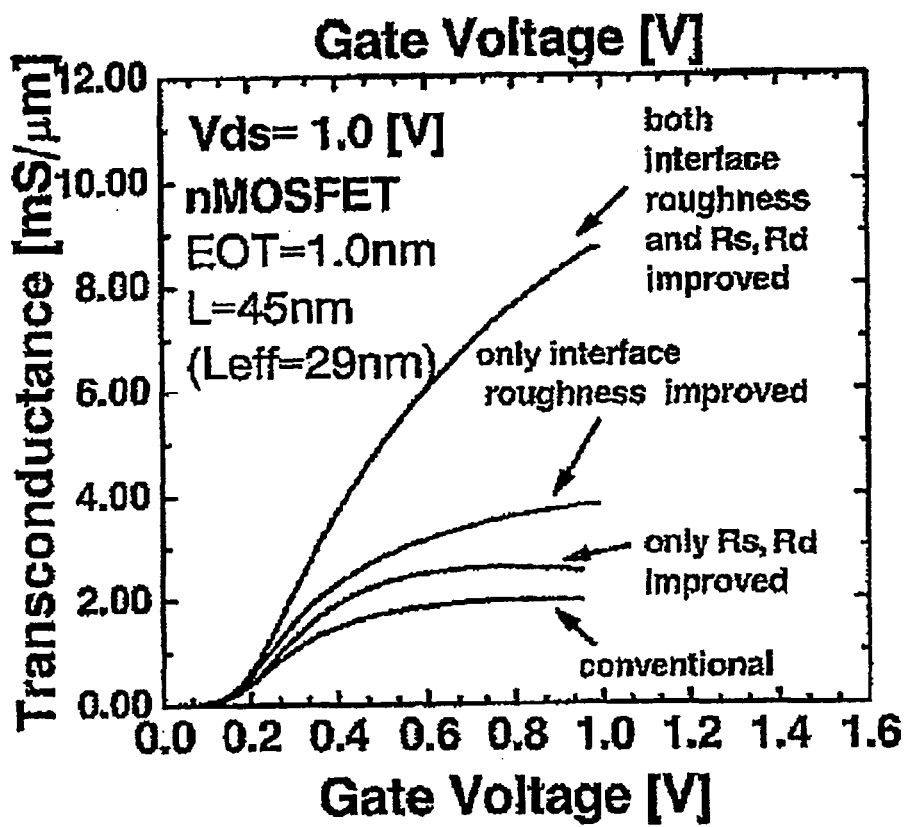
FIG. 6D is a diagram showing the gm-VG characteristics in the linear region of nMOSFETs according to this invention.
Figure 7A:
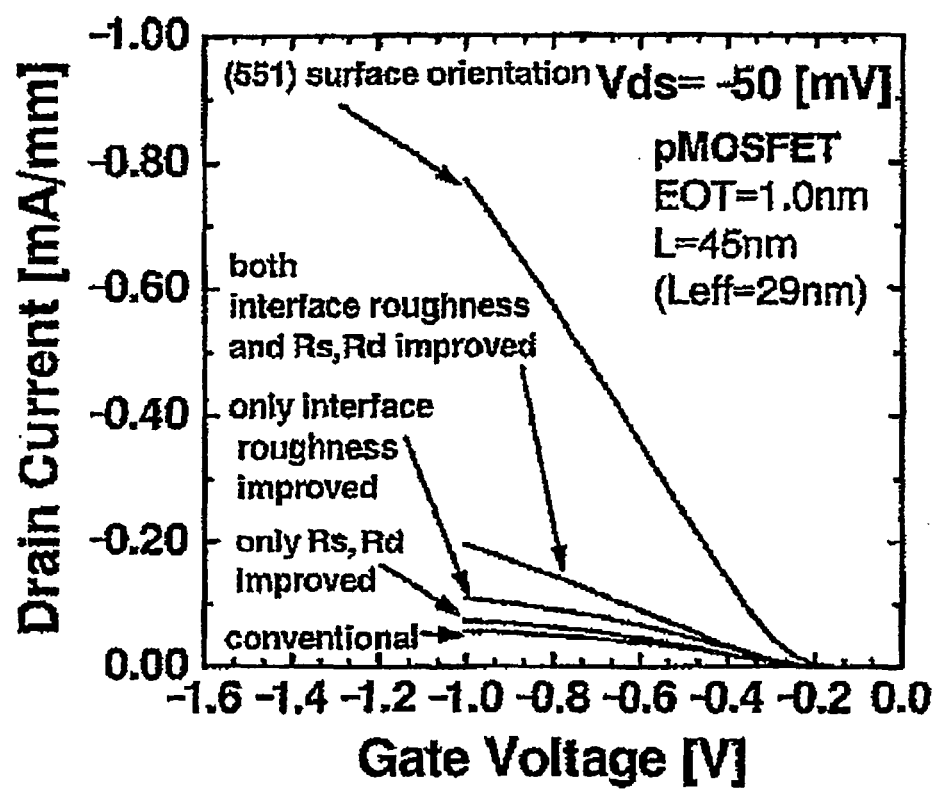
FIG. 7A is a diagram showing the ID-VG characteristics in the saturation region of pMOSFETs according to this invention.
Figure 7B:
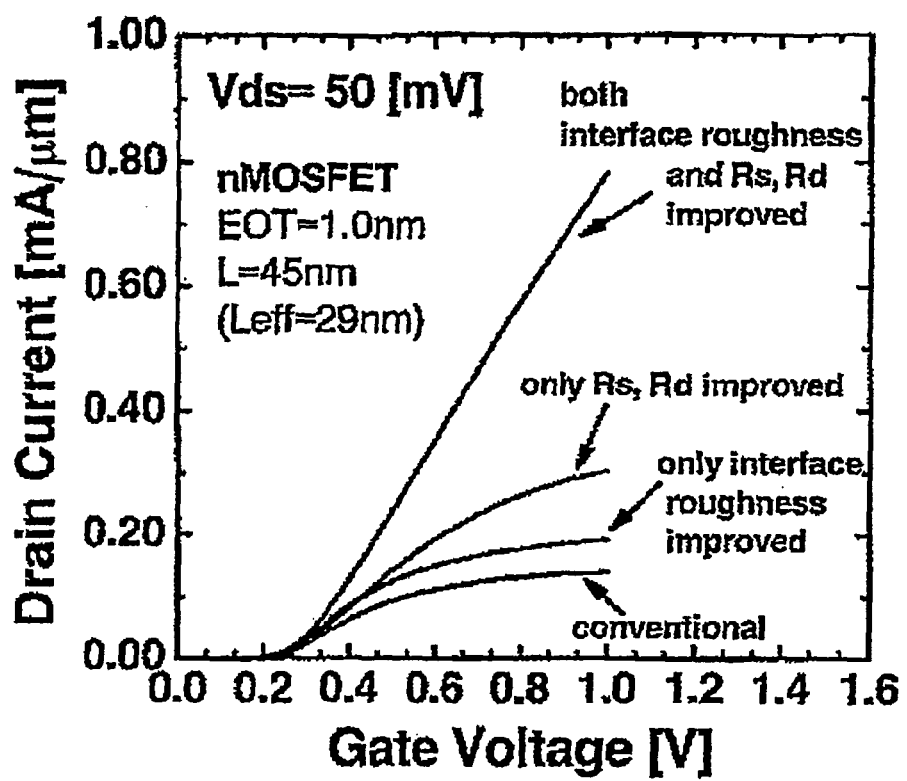
FIG. 7B is a diagram showing the ID-VG characteristics in the saturation region of nMOSFETs according to this invention.
Figure 7C:
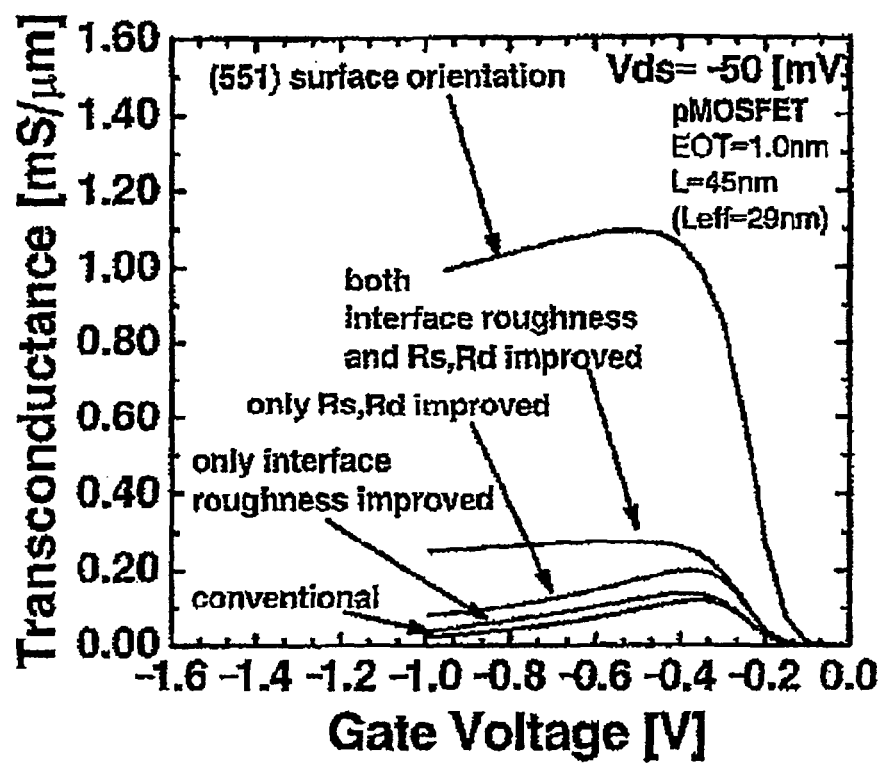
FIG. 7C is a diagram showing the gm-VG characteristics in the saturation region of pMOSFETs according to this invention.
Figure 7D:
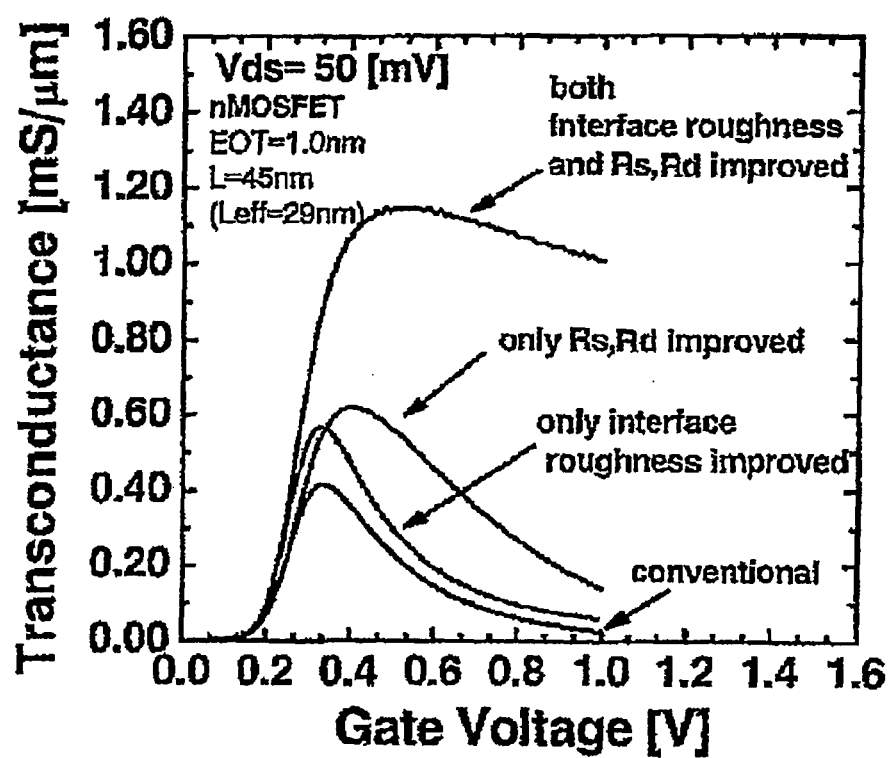
FIG. 7D is a diagram showing the gm-VG characteristics in the saturation region of nMOSFETs according to this invention.

FIGS. 5A and 5B show the results of performing simulations about the characteristics in the linear region of pMOS- FETs each having the size shown in the characteristic diagram of FIG. 1A. FIG. 5A shows the drain current ID-gate voltage VG characteristics and FIG. 5B shows the transconductance gm-gate voltage VG characteristics. In FIG. 5A, curve C21 represents the characteristics obtained when the flatness degree of the surface of a channel region is reduced, and curve C22 represents the characteristics when the series resistances Rs and Rd are reduced. In either case, it is seen that the characteristics are improved as compared with the characteristics of the conventional MOSFET indicated by a thick solid line (corresponding to the case of VD=−50 mV in FIG. 1A). Further, as shown by curve C23, the drain current ID can be further increased by reducing the flatness degree and the series resistances Rs and Rd. Furthermore, as shown by curve C24, the drain current ID can be extremely improved when the (110) plane is used.

Also in the transconductance gm-gate voltage VG characteristics shown in FIG. 5B, as shown by curves C21a and C22a, the transconductance gm can be increased by individually reducing the flatness degree and the series resistances (Rs, Rd) as compared with the conventional pMOSFET indicated by a thick solid line. Further, when the flatness degree and the series resistances are both reduced, the transconductance gm can be further increased as shown by curve C23a. Furthermore, as shown by curve C24a, the transconductance gm can be extremely improved in the pMOSFET improved in both the flatness degree and the series resistances and using the (110) plane.

FIGS. 6A to 6D and FIGS. 7A to 7D show the characteristics in the linear region and the saturation region when transistors are reduced in size. Herein, in each transistor, the thickness of a gate insulating film is 1.0 nm by EOT and the gate length is 45 nm (effective length 29 nm). FIGS. 6A, 6C, 7A, and 7C show the VG-ID characteristics and the VG-gm characteristics of p-channel transistors whose channel surfaces are the (551) plane. FIGS. 6B, 6D, 7B, and 7D show the VG-ID characteristics and the VG-gm characteristics of n-channel transistors whose channel surfaces are the (100) plane. FIGS. 6A to 6D and FIGS. 7A to 7D respectively show that the drain current ID and the transconductance gm can be increased as compared with the conventional pMOSFET and nMOSFET by individually reducing the flatness degree of the surface of the channel region and the series resistances (Rs, Rd) and that the drain current ID and the transconductance gm can be synergistically increased when the flatness degree and the series resistances (Rs, Rd) are both reduced.

The process for obtaining the above flatness degree of the surface of the channel region will be described. As a technique for flattening the surface of a silicon substrate, there is a technique of flattening by alkali-free cleaning and/or by the use of a sacrificial oxide film. If a technique described in Japanese Unexamined Patent Application Publication (JP-A) No. 2004-200672 is employed as such a flattening technique, the average roughness Ra of the surface of a silicon substrate can be set to 0.15 nm or less. However, the peak-to-valley (P-V) value on the surface with an average roughness (Ra) of 0.15 nm or less obtained by this technique is normally about 1.0 nm and, at most, 0.6 to 0.9 nm. With the flatness degree at this level, it is difficult to improve the drain current ID and the transconductance gm.

As a result of studying a technique for further reducing the peak-to-valley (P-V) value in consideration of the above fact, the present inventors have confirmed the following. Using a cleaning solution obtained by adding 30% IPA to hydrogen-added ultrapure water with an oxygen content of 1 ppb or less, the surface was cleaned in a nitrogen atmosphere (oxygen content 1 ppb or less) in a light-shielded state, and then a gate insulating film was formed by isotropic oxidation or nitriding (oxidation or nitriding by oxygen radicals or nitrogen radicals using a high-density plasma). As a result, it was possible to set the peak-to-valley (P-V) value to about 0.16 nm or less and thus to enhance the flatness degree of the interface to about a level difference (0.13 nm) corresponding to one atom which is the limit of flatness, as shown in FIG. 8B. It has been found that if cleaning is carried out with an IPA-added cleaning solution in a light-shielded state with no oxygen present, the flatness degree can be enhanced to its limit even with the presence of alkali. Further, it has been found that the surface flattening is facilitated on a plane offset from the (100) plane by 4 degrees and that the flattening is easy to perform on the (551) plane, i.e. a plane offset from the (110) plane by 8 degrees, if there is no light or oxygen.

Figure 8A:
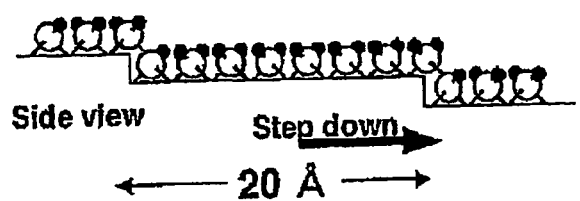
FIG. 8A is an exemplary diagram showing states of silicon surfaces in MOSFETs according to this invention.
Figure 8A:
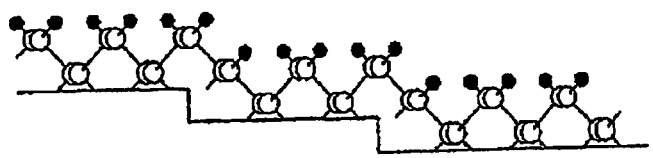
Figure 8B:
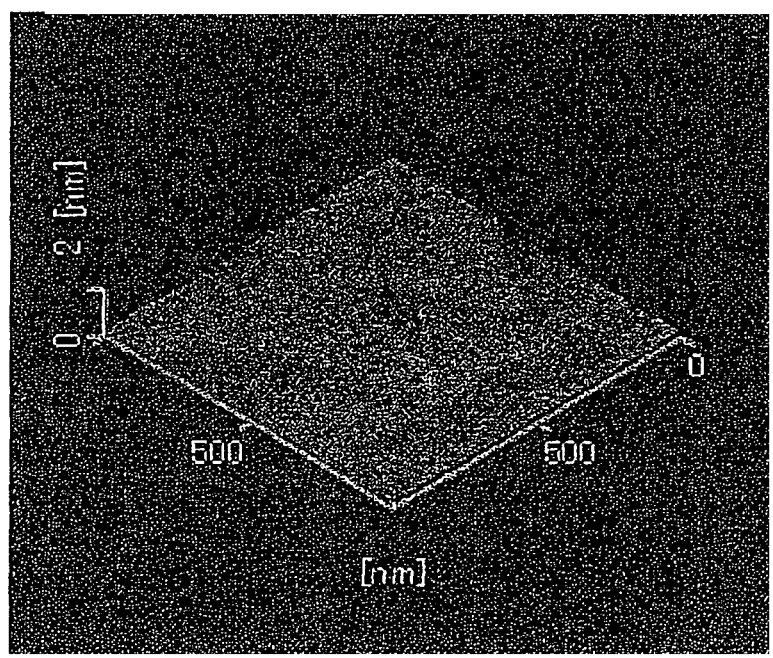
FIG. 8B is a microphotograph showing a state of a silicon surface in a MOSFET according to this invention.

FIGS. 8A and 8B are an exemplary diagram and a surface photograph of silicon surfaces each having a level difference (0.13 nm) corresponding to one atom which is the limit of flatness. FIG. 8A shows the side of a plane offset from the (100) plane by 4 degrees, wherein 8 atoms are arranged on the surface of a terrace with a width of 20 Å having a level difference corresponding to one oxygen atom. FIG. 8A also illustrates an atomic arrangement on the (551) plane, i.e. a plane offset from the (110) plane by 8 degrees, wherein it is seen that the flatness degree is a level difference corresponding to one atom. FIG. 8B shows the terrace-like surface on a plane offset from the (100) plane by 4 degrees. If the source direction/drain direction is set in a direction along the terrace, the flat surface utilization effect is more enhanced.

Figure 9A:
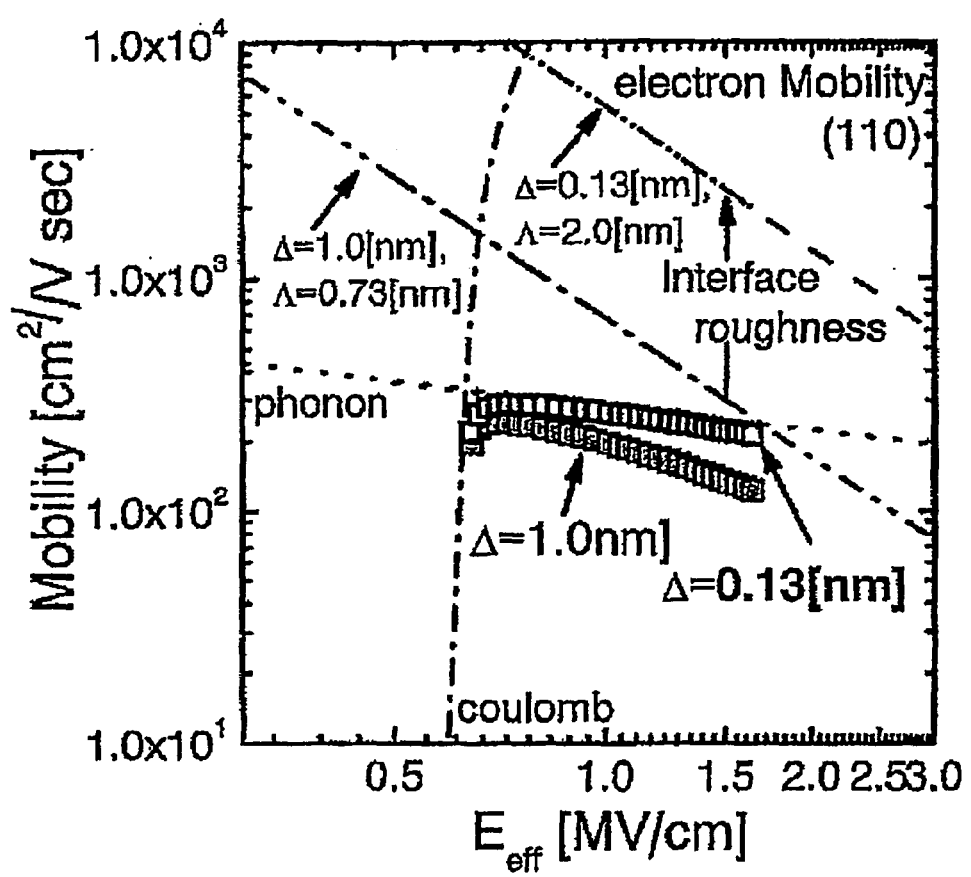
FIG. 9A is a diagram showing the relationships between the channel electric field Eeff and the mobility.
Figure 9B:
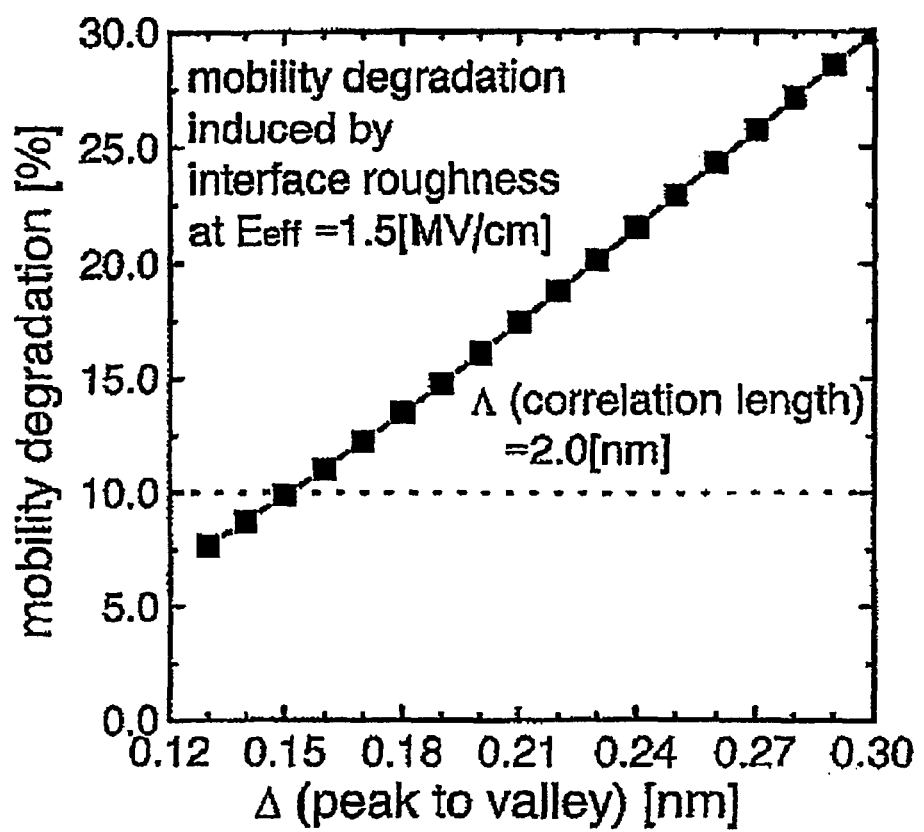
FIG. 9B is a diagram showing the relationship between the flatness degree of the silicon/gate insulating film interface and the mobility.
Figure 10A:
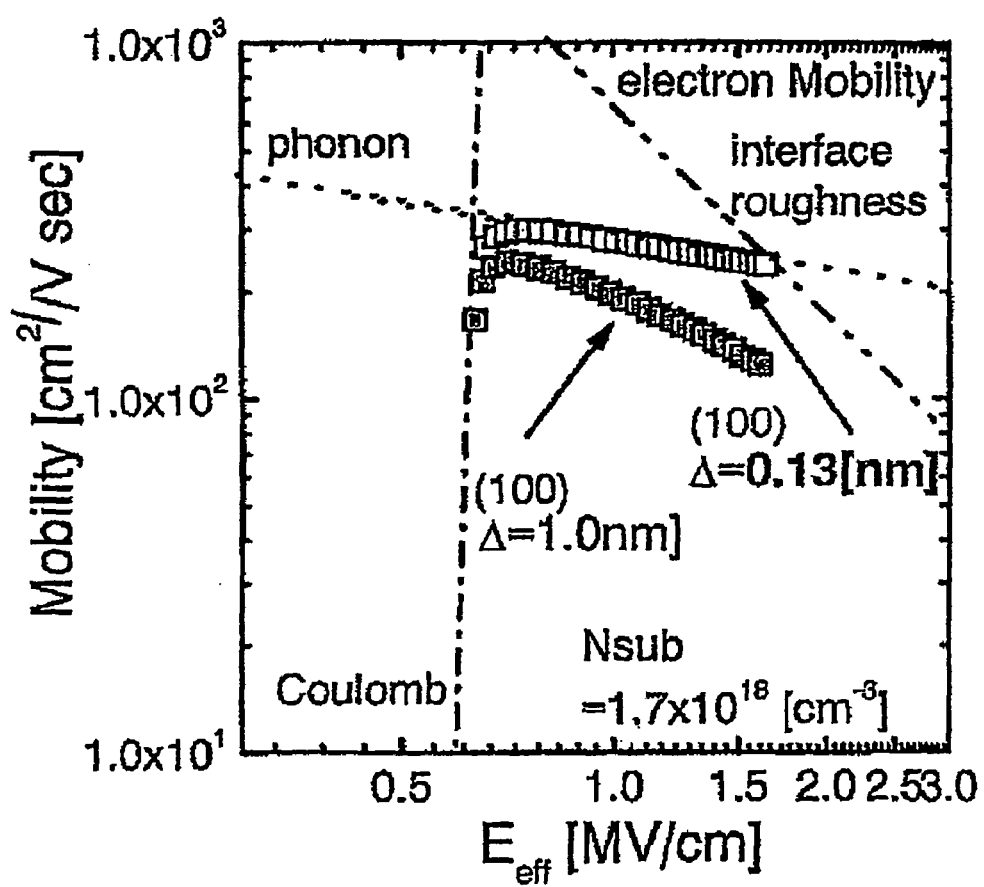
FIG. 10A is a diagram showing the relationships between the flatness degree of the silicon/gate insulating film interface and the mobility in nMOSFETs according to this invention.
Figure 10B:
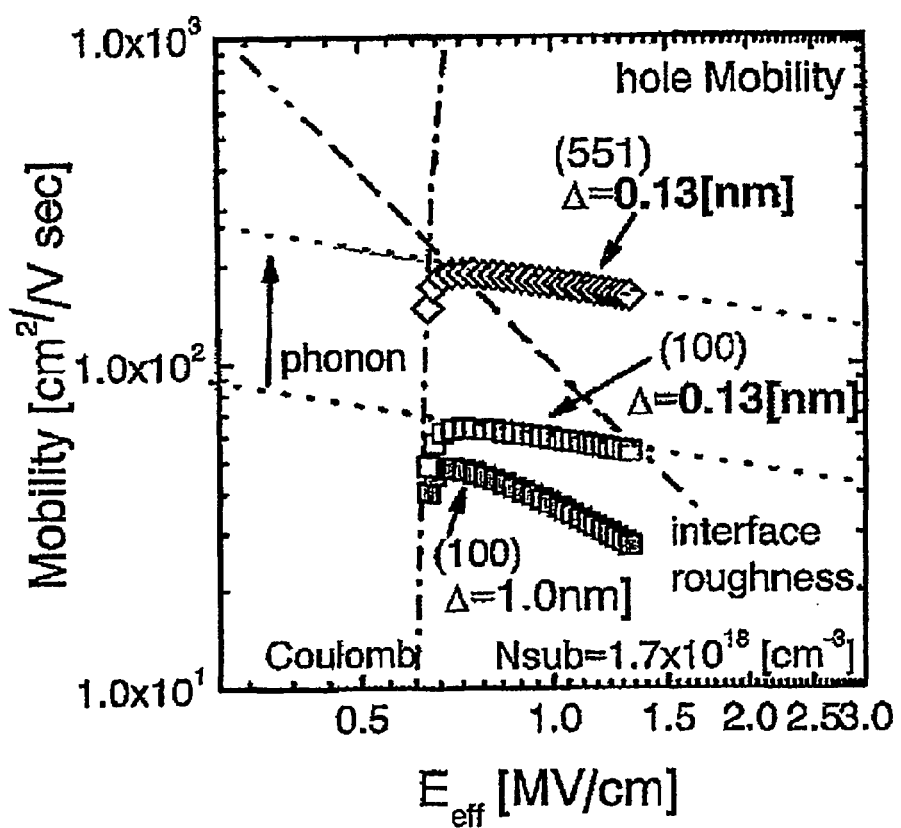
FIG. 10B is a diagram showing the relationships between the flatness degree of the silicon/gate insulating film interface and the mobility in pMOSFETs according to this invention.

Herein, referring to FIGS. 9A, 10A, and 10B, an influence of phonon scattering (see a dotted line), an influence of Coulomb scattering (see a chain line), and an influence of interface scattering (see a two-dot chain line) on carrier mobility are shown by electric field Eeff functions of mobility. FIGS. 9A and 10A show the case of (100)-plane nMOSFETs (scales of the ordinate axes are different). Referring to them, it is seen that when the surface flatness degree is the limit value (Δ=0.13 nm) (Λ represents the length of a channel in the source-drain direction and a (P-V) value over that length is a Δ value), the carrier mobility is substantially determined only by the influence of phonon scattering, while, when the surface flatness degree is 1.0 nm in terms of a peak-to-valley (P-V) value (further the length is 0.73 nm), the mobility is largely degraded. FIG. 9B shows the degree of this degradation in the case where the electric field Eeff is 1.5 MV/cm. As shown in FIG. 9B, since the degradation is 10% or less when the flatness degree is 0.16 nm or less and 30% or less when 0.30 nm or less, the surface flatness degree of this invention is determined to be 0.30 nm or less. FIG. 10B shows that, in the case of pMOSFETs, the carrier mobility improving effect by the surface flattening is large even when the surface is the (100) plane and, if the surface is the (551) plane, the effect of Coulomb scattering is reduced so that the carrier mobility further increases.

Next, the reduction in series resistance will be described in detail. In a conventional semiconductor device, the same metal silicide (e.g. TiSi) is used as an electrode material in both an nMOSFET and a pMOSFET. The work function of this electrode material is about −4.6 eV. The reason is that the level difference between a conduction band (−4.05 eV) and a forbidden band (−5.15 eV) of silicon forming $n^+$ regions, i.e. source and drain regions, of the conventional nMOSFET is 1.1 eV and, in this case, a work function difference (barrier height) $q\phi_{BN}$ between the conduction band of the silicon and the electrode material is 0.55 eV. Likewise, a work function difference (barrier height) $q\phi_{BP}$ between a conduction band of silicon forming $p^+$ regions, i.e. source and drain regions, of the conventional pMOSFET and the electrode material is also 0.55 eV. By setting the barrier heights equal to each other in this manner, the contact resistances in both transistors are set equal to each other. As a result, the contact resistance Rc is as high as about $1 \times 10^{-8}$ $\Omega cm^2$ and the series resistance Rs is 100 $\Omega \cdot \mu m$.

In this invention, regardless of an n-channel transistor or a p-channel transistor, use is made of an electrode material whose barrier height with source and drain regions becomes 0.32 eV or less, preferably 0.2 eV or less. That is, by forming electrodes from a material that has a barrier height $q\phi_{BN}$ between $n^+$ silicon regions and the electrodes to be 0.32 eV or less, preferably 0.2 eV or less and forming electrodes from a material that has a barrier height $q\phi_{BP}$ between $p^+$ silicon regions and the electrodes to be also 0.32 eV or less, preferably 0.2 eV or less, the foregoing series resistances (Rs, Rd) can be reduced. In this case, it is necessary that the material of the electrodes contacting the $n^+$ silicon regions be different from the material of the electrodes contacting the $p^+$ silicon regions.

Accordingly, in a semiconductor device according to this invention, different metals or metal silicides are used in $n^+$ silicon regions and $p^+$ silicon regions. Specifically, in an nMOSFET, electrodes are formed by using a metal or a metal silicide whose work function becomes −4.37 eV (preferably −4.25 eV) or more, for example, such as Er, Mg, Mn, Cd, Hf, Y, Zr, or a silicide thereof. On the other hand, in a pMOSFET, electrodes are formed by using a metal or a metal silicide whose work function becomes −4.85 eV (preferably −4.95 eV) or less, for example, such as Pd, Pt, Co, Ni, Ir, or a silicide thereof. By forming the electrodes using such materials, the contact resistance Rc can be set to $1 \times 10^{-10}$ $\Omega cm^2$ or less, preferably $1 \times 10^{-11}$ $\Omega cm^2$ or less.

Figure 11:
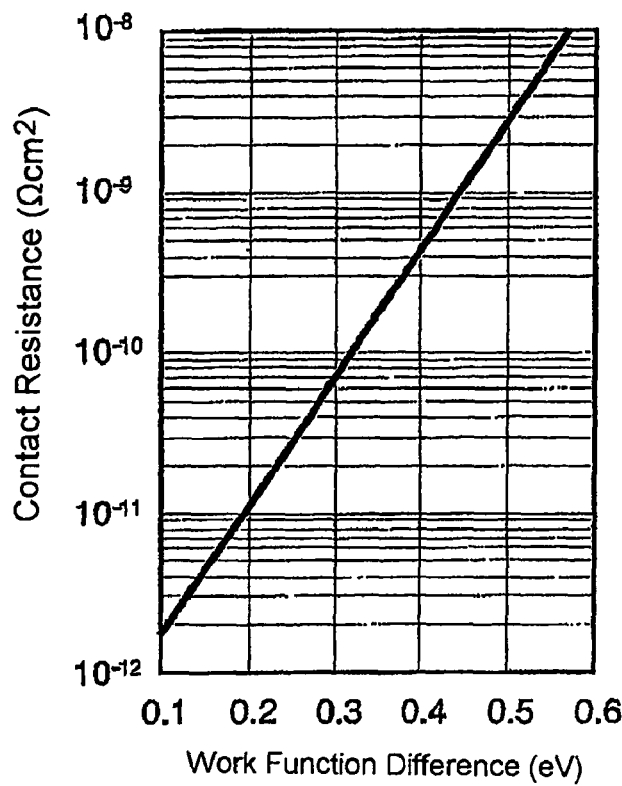
FIG. 11 is a graph showing the relationship between the contact resistance Rc and the work function difference between an electrode and a silicon region.

Referring to FIG. 11, there is shown the relationship between the contact resistance Rc and the electrode-silicon region work function difference. As is clear from FIG. 11, when the electrode-silicon region work function difference is 0.5 eV, the contact resistance Rc is about $10^{-8}$ $\Omega cm^2$. If the contact resistance Rc is large like this, the MOSFET drain current ID and transconductance gm cannot be improved as described before.

On the other hand, according to the study by the present inventors, if the above electrode-silicon region work function difference is set to 0.32 eV or less, the contact resistance Rc can be set to $10^{-10}$ $\Omega cm^2$ or less, and preferably, if the work function difference is set to 0.2 eV or less, the contact resistance Rc can be set to $10^{-11}$ $\Omega cm^2$ or less. As a result, as described before, the MOSFET characteristics can be improved. In order to achieve the work function difference of 0.32 eV or less, the present inventors have confirmed that the work function difference can be set to 0.32 eV or less by using mutually different metals as electrodes contacting $n^+$ silicon regions and $p^+$ silicon regions.

Therefore, if a material having a work function close to −4.05 eV, i.e. Er (−3.2 eV), Mg (−3.7 eV), Mn (−4.1 eV), Cd (−4.3 eV), Hf (−3.9 eV), Y (−3.1 eV), or Zr (−4.1 eV), is used as an electrode material of electrodes contacting $n^+$ silicon regions, the above work function difference can be achieved. On the other hand, if a material having a work function close to −5.15 eV, i.e. Pd (−5.2 eV), Pt (−5.6 eV), Co (−5.0 eV), Ni (−5.2 eV), or Ir (−5.3 eV), is used as an electrode material of electrodes contacting $p^+$ silicon regions, the work function difference of 0.2 eV or less can be realized.

With respect to the series resistance, it can be largely reduced by setting the contact resistance to $10^{-10}$ $\Omega cm^2$ or less, preferably $10^{-11}$ $\Omega cm^2$ or less as described above, and can be set to preferably 1 $\Omega \cdot \mu m$ in total of the contact resistance and an internal resistance of the source region and the drain region. Herein, as compared with an ideal case where the series resistance is set to zero, if the series resistance is 1.5 $\Omega \cdot \mu m$ or less, degradation of the transconductance gm is 1% or less and thus is negligible. Therefore, although the series resistance is determined to be 1.50 $\Omega \cdot \mu m$ or less, it may be set to 4 $\Omega \cdot \mu m$ or less depending on the other conditions.

Further, source and drain regions are not necessarily formed of a semiconductor, but may be formed of a metal or a metal silicide whose work function difference with respect to a semiconductor of a channel region is 0.32 eV or less, preferably 0.2 eV or less. In this case, the material may be selected in the same manner as described above. As a result, there is no internal resistance of the source region and the drain region so that the series resistance can be further reduced.

Figure 12A:
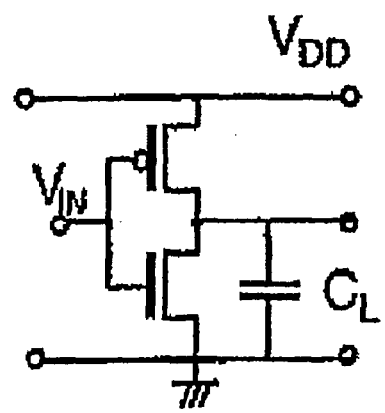
FIG. 12A is a diagram illustrating the structure of a CMOS circuit comprising MOSFETs.
Figure 12B:
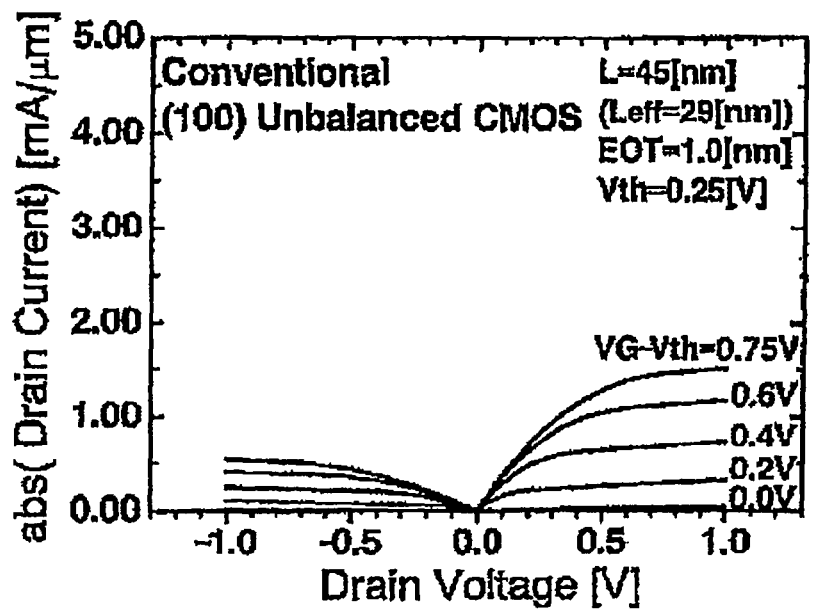
FIG. 12B is a drain voltage-drain current characteristic diagram of conventional MOSFETs.

Referring to FIG. 12A, there is illustrated a CMOS circuit comprising an nMOSFET and a pMOSFET, i.e. an inverter circuit. Herein, when the circuit has a conventional structure in which the nMOSFET and the pMOSFET illustrated in FIG. 12A are both formed on the (100) plane, the drain current is small and is extremely small particularly in the pMOSFET and thus both are unbalanced as shown in FIG. 12B. In this case, since the current driving capability of the pMOSFET is about 30% of that of the nMOSFET, the size of the pMOSFET is enlarged correspondingly when forming the gate illustrated in FIG. 12A.

Figure 12C:
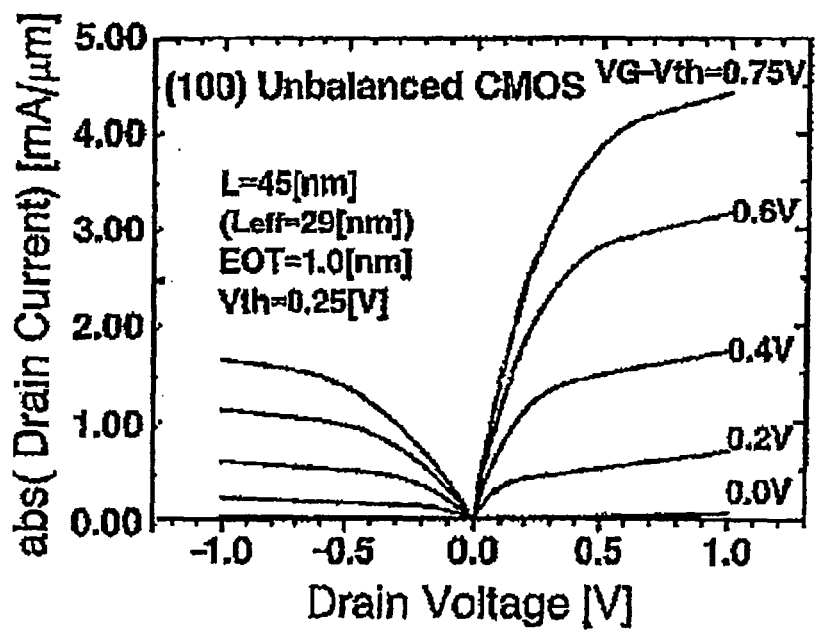
FIG. 12C is a drain voltage-drain current characteristic diagram of MOSFETs according to this invention.

When the nMOSFET and the pMOSFET illustrated in FIG. 12A are both formed on the (100) plane, but each transistor is improved in flatness degree on the surface of a channel region, i.e. on the interface between the channel region and a gate insulating film, and has a series resistance of $10^{-11}$ $\Omega cm^2$ or less according to this invention, the drain current of each transistor increases significantly as shown in FIG. 12C. Also in this case, since the current driving capability of the pMOSFET is about 30% of that of the nMOSFET, the size of the pMOSFET is enlarged correspondingly when forming the gate illustrated in FIG. 12A.

Figure 12D:
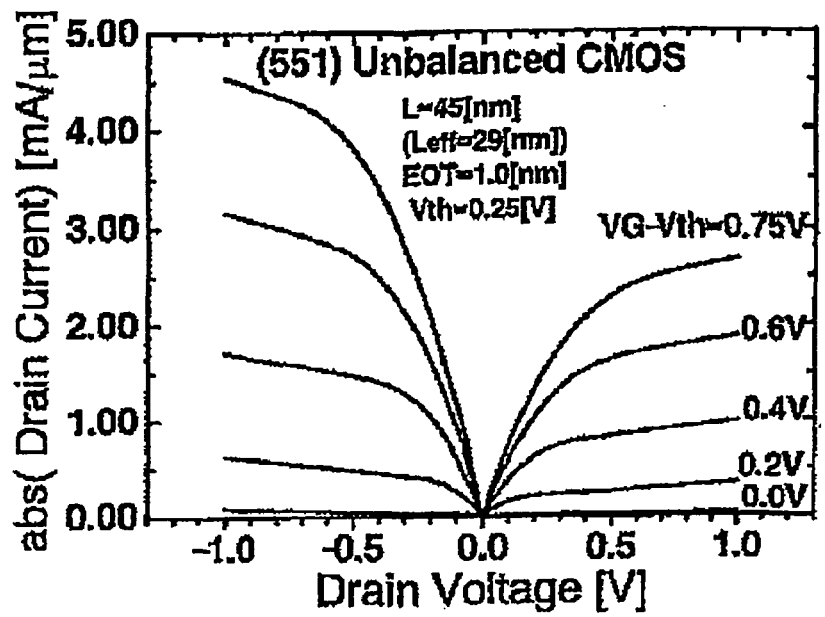
FIG. 12D is a drain voltage-drain current characteristic diagram of MOSFETs according to this invention.

Next, when the nMOSFET and the pMOSFET illustrated in FIG. 12A are both formed on the (551) plane and, further, each transistor is improved in flatness degree on the surface of a channel region, i.e. on the interface between the channel region and a gate insulating film, and has a series resistance of $10^{-11}$ $\Omega cm^2$ or less according to this invention, the drain current of each transistor, particularly the pMOSFET, increases significantly as shown in FIG. 12D. The current driving capability of the nMOSFET is about 60% as compared with the case of FIG. 12C, but still, is increased as compared with the conventional structure (see FIG. 12B). In this case, since the current driving capability of the nMOSFET is about 60% of that of the pMOSFET, the size of the nMOSFET is enlarged correspondingly when forming the gate illustrated in FIG. 12A.

Figure 12E:
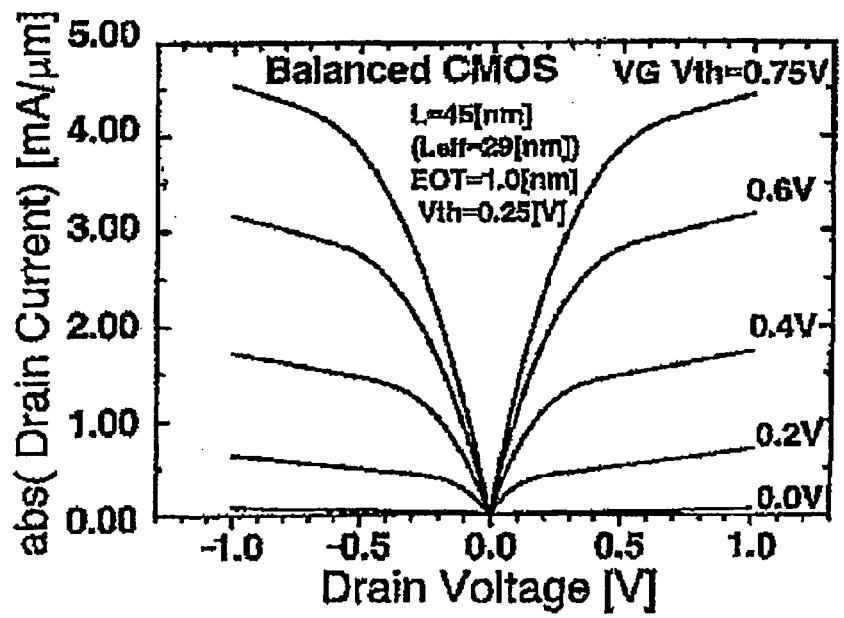
FIG. 12E is a drain voltage-drain current characteristic diagram of MOSFETs according to this invention.
Figure 15A:
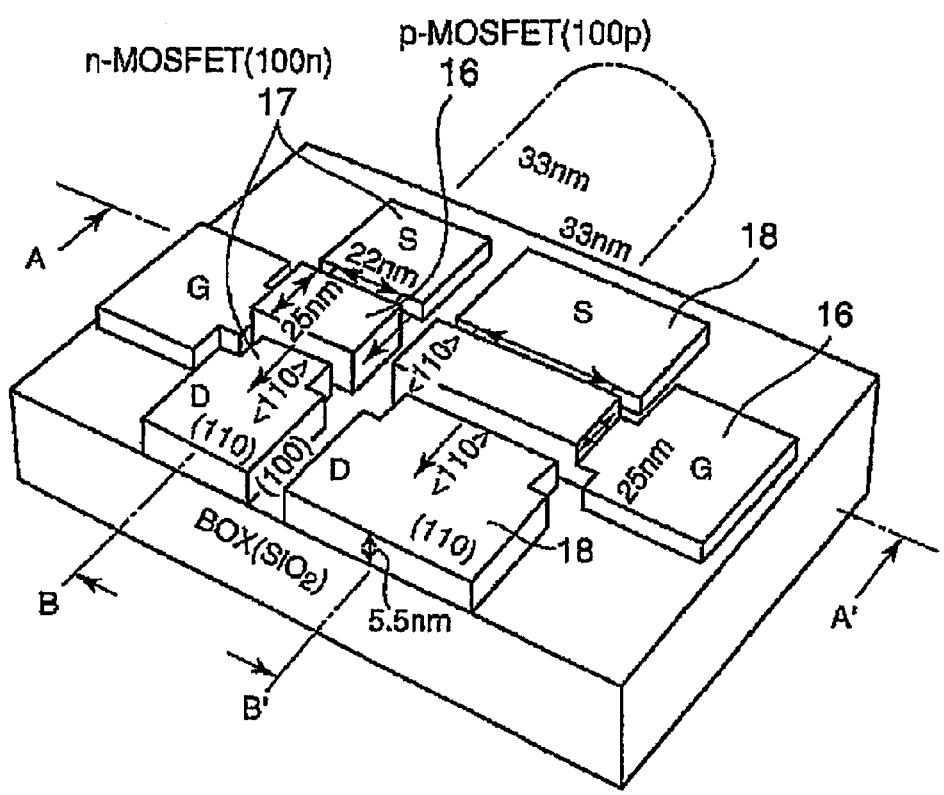
FIG. 15A is a schematic perspective view of a semiconductor device (CMOS circuit) according to a second embodiment of this invention.
Figure 15B:
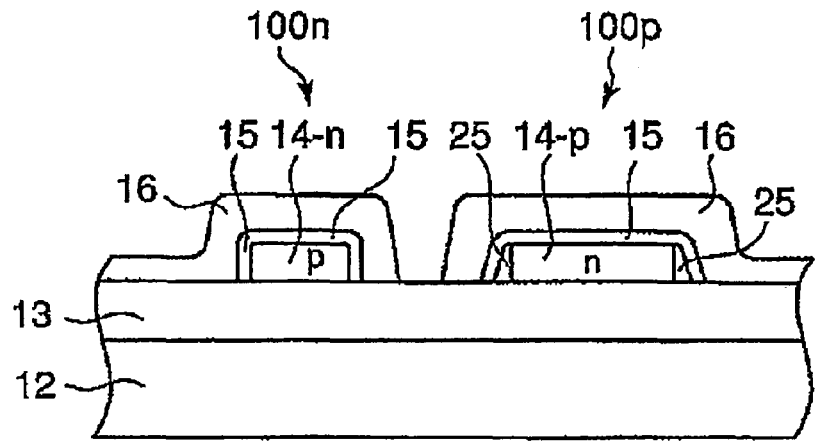
FIG. 15B is a sectional view taken along line A-A' in FIG. 15A.
Figure 15C:
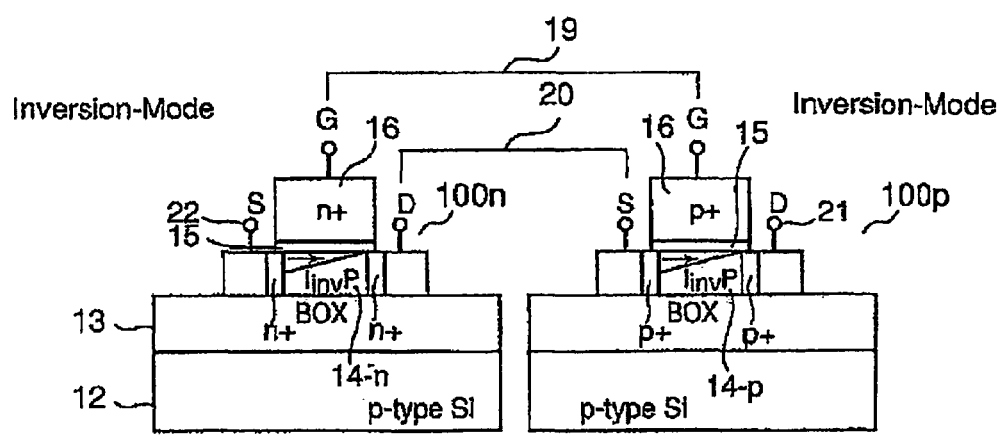
FIG. 15C is a sectional view taken along line B-B' in FIG. 15A.

When the nMOSFET and the pMOSFET illustrated in FIG. 12A are both formed on the (551) plane while the nMOSFET is formed into a three-dimensional structure also using the (100) plane so as to fully balance the areas and the current driving capabilities of both transistors like in an embodiment of FIGS. 15A to 15C, and further, each transistor is improved in flatness degree on the surface of a channel region and has a series resistance of $10^{-11}$ $\Omega cm^2$ or less according to this invention, the drain currents of both transistors increase significantly in a balanced manner as shown in FIG. 12E. The CMOS circuit in which the areas and the current driving capabilities of both transistors are fully balanced as described above is called a balanced CMOS circuit. Since an nMOSFET and a pMOSFET having mutually equal characteristics are described in detail in the specification of Japanese Patent Application No. 2005-369170, a description thereof is omitted herein.

Referring to FIG. 13A, the operable clock frequency is 5 GHz at most with the CMOS gate having the structure described with reference to FIG. 12B. However, with the CMOS gate having the structure according to this invention described with reference to FIG. 12C, the operable clock frequency increases to 10 GHz. Further, with the CMOS gate having the structure according to this invention described with reference to FIG. 12D, the operable clock frequency increases to 20 GHz. Further, with the CMOS gate having the structure according to this invention described with reference to FIG. 12E, the operable clock frequency increases to 30 GHz. Although inversion-mode transistors are used in all these examples, if accumulation-mode transistors are used, the operable clock frequencies of CMOS gates having the structures according to this invention increase to 20 GHz, 40 GHz, and 60 GHz, respectively.

Figure 13B:
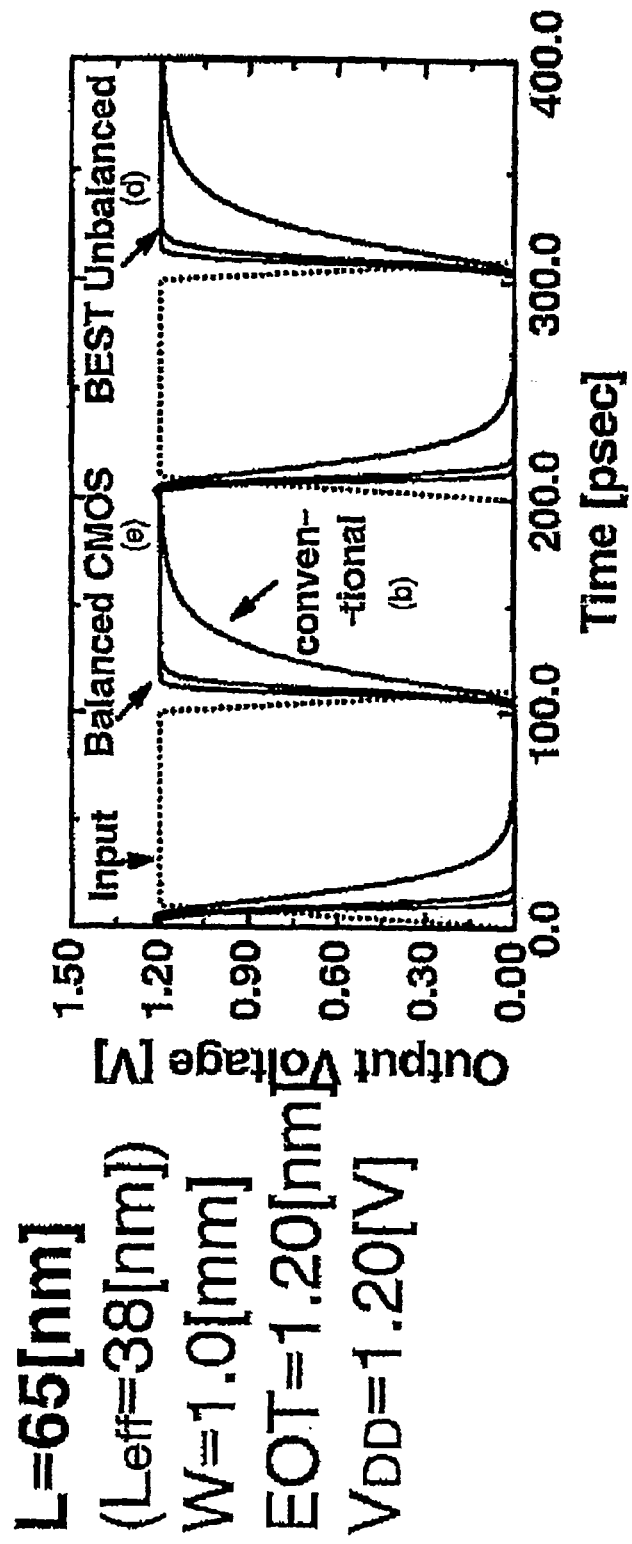
FIG. 13B is a diagram showing input/output characteristics of a conventional CMOS circuit and CMOS circuits according to this invention.

Referring to FIG. 13B, there are shown input/output characteristics obtained when the above balanced CMOS circuit and conventional CMOS circuit are driven by a 10 GHz clock. In FIG. 13B, an input signal is represented by a broken line, an output signal of the balanced CMOS circuit by e, an output signal of the conventional CMOS circuit (CMOS circuit having the structure described with reference to FIG. 12B) by b, and an output signal of the CMOS circuit having the structure described with reference to FIG. 12D by d. There are shown the characteristics in the case where each of the MOSFETs forming the circuits has a size with a channel length L of 65 nm (effective channel length Lee=38 nm), a channel width of 1.0 nm, and an effective insulating film thickness (EOT) of 1.20 nm and the power supply voltage (VDD) is 1.20V. When the clock at a frequency of about 10 GHz is applied as in FIG. 13B, the output signal b of the conventional CMOS circuit exhibits a considerable delay.

Figure 13C:
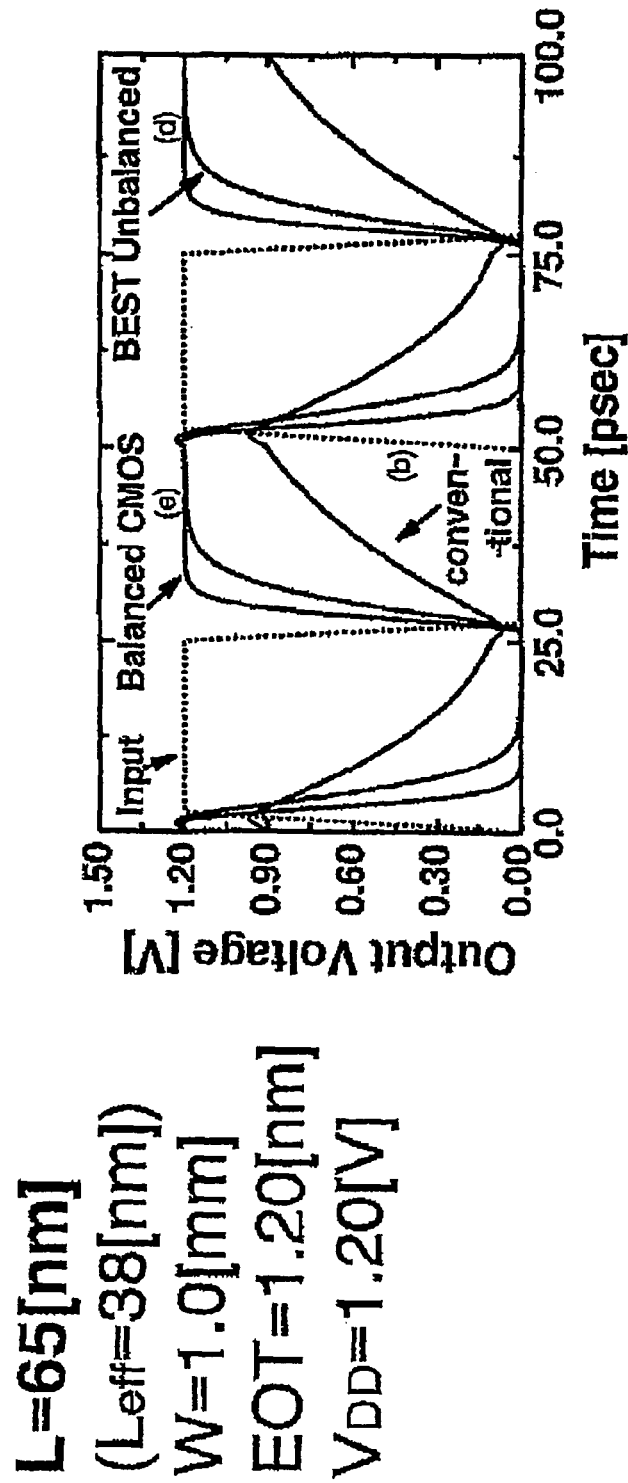
FIG. 13C is a diagram showing input/output characteristics of a conventional CMOS circuit and CMOS circuits according to this invention.

In FIG. 13C, there are shown input/output characteristics obtained when 40 GHz clock signals are fed as input signals to the above three CMOS circuits, respectively. As is clear from FIG. 13C, it is seen that an output signal b of the conventional CMOS circuit is largely delayed relative to the input signal and, further, largely reduced in amplitude and thus is unfit for use. On the other hand, as seen from an output signal e, the balanced CMOS circuit can normally operate even when the clock frequency increases to as high as 40 GHz.

Figure 13D:
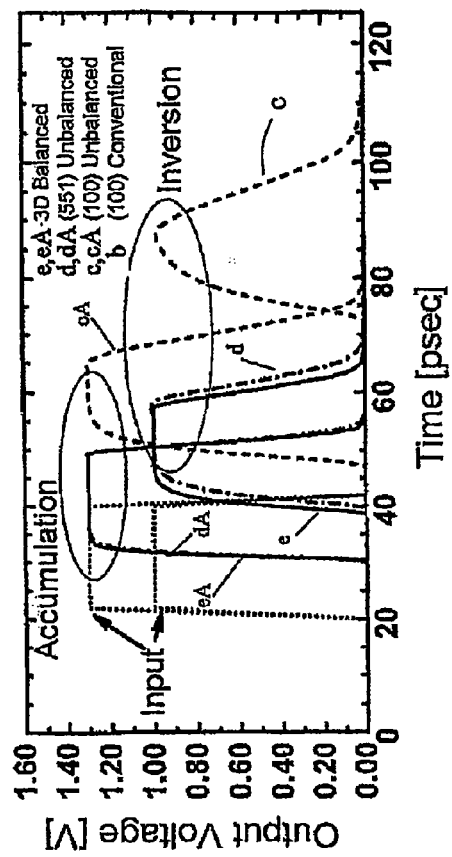
FIG. 13D is a diagram showing input/output characteristics of a conventional CMOS circuit and CMOS circuits according to this invention.
Figure 13D:
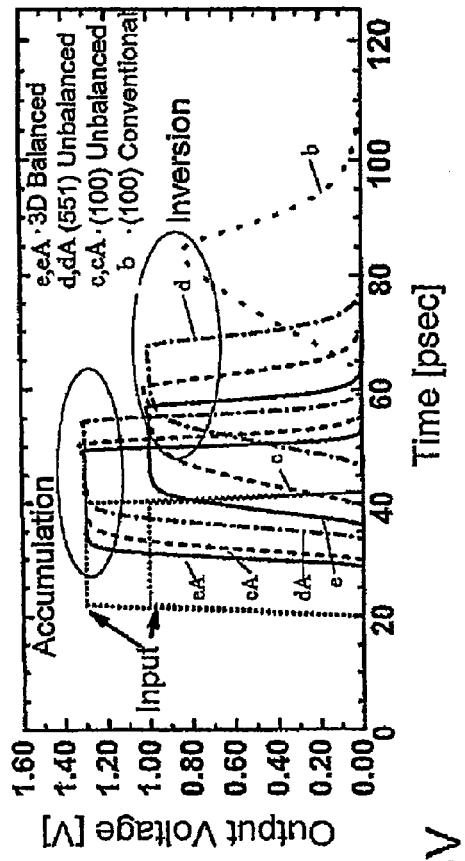

Referring to FIG. 13D, there are shown input/output waveforms obtained when four-input NOR gates and four-input NAND gates are respectively formed by using the CMOS circuits described with reference to FIGS. 12B, 12C, 12D, and 12E and the gates are connected tandem in ten stages for each and operated at a clock frequency of 50 GHz. There are shown an input pulse waveform fed to one input of the initial stage of each of the ten-stage tandem four-input gates and an output signal extracted from an output of the final stage. To the other three inputs of each gate, a ground potential is applied in the case of the NOR gate, while, a power supply voltage is applied in the case of the NAND gate. The input signal is 1.0V in the case of the CMOS circuit using inversion-mode transistors and is 1.2V in the case of the CMOS circuit using accumulation-mode transistors. Output waveforms b, c, d, and e respectively represent the case where use is made of the conventional CMOS circuits each described with reference to FIG. 12B, the case where use is made of the CMOS circuits each having the structure according to this invention described with reference to FIG. 12C, the case where use is made of the CMOS circuits each having the structure according to this invention described with reference to FIG. 12D, and the case where use is made of the balanced CMOS circuits each having the structure according to this invention described with reference to FIG. 12E (inversion-mode transistors are used in all the cases). On the other hand, output waveforms cA, dA, and eA respectively represent the case where use is made of the CMOS circuits each using accumulation-mode transistors and each having the structure according to this invention described with reference to FIG. 12C, the case where use is made of the CMOS circuits each using accumulation-mode transistors and each having the structure according to this invention described with reference to FIG. 12D, and the case where use is made of the balanced CMOS circuits each using accumulation-mode transistors and each having the structure according to this invention described with reference to FIG. 12E. The waveform b is not obtained in the case of the NOR gate, i.e. the signal does not reach the tenth stage in the conventional circuit. In all the gates having the structures of this invention, the outputs are obtained as illustrated. Although the output waveform b of the conventional circuit is obtained in the case of the NAND gate, a considerable delay and deformation of the waveform are observed. On the other hand, in all the gates having the structures of this invention, delays are small and, further, no waveform rounding is observed.

First Embodiment

Figure 14:
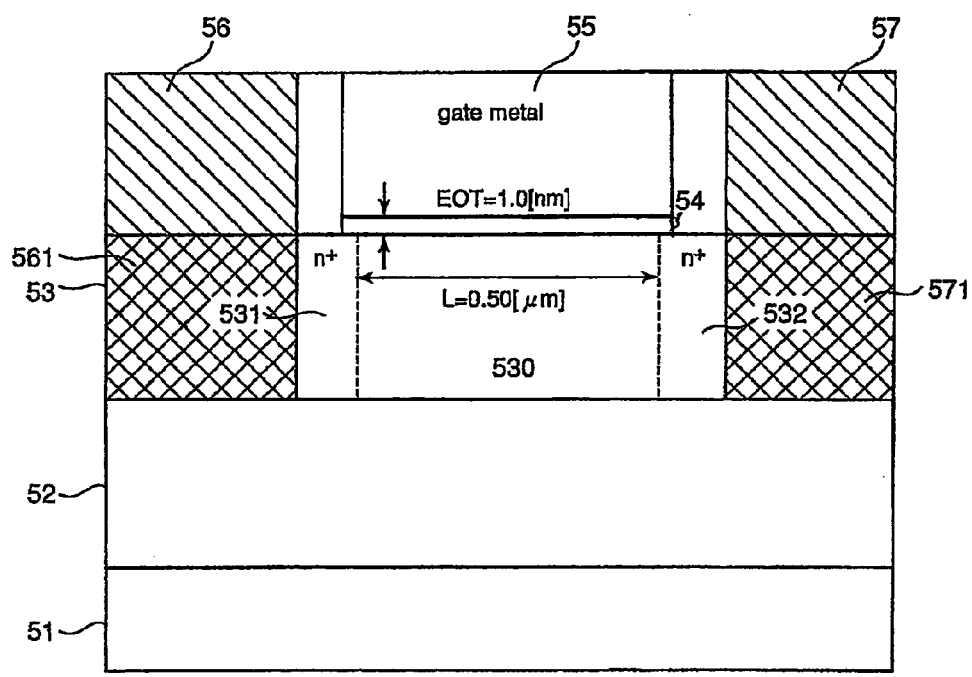
FIG. 14 is a sectional view for specifically explaining the structure of a MOSFET according to a first embodiment of this invention.

Referring to FIG. 14, there is illustrated a specific structural example of a MOSFET according to a first embodiment of this invention. The MOSFET illustrated in FIG. 14 is an nMOSFET having a buried insulating layer (BOX) 52 on a p-type silicon substrate or a metal substrate 51 and an SOI layer 53 formed on the BOX 52. Herein, the BOX 52 has a thickness of 10.0 nm and is formed of $SiO_2$, while, the SOI layer 53 is in the form of an n$^+$ silicon layer having a thickness of 20.0 nm. The SOI layer 53 is formed with a channel region 530 having an impurity concentration of $3\times10^{18}$ cm$^{-3}$ and a source region 531 and a drain region 532 formed on both sides of the channel region 530 and each having a higher concentration than that of the channel region. The channel region 530 has a channel length L of 0.50 μm. Further, a gate insulating film 54 formed of silicon nitride and having a $SiO_2$ equivalent thickness (EOT) of 1.0 nm is formed on the surface of the channel region 530 and a gate electrode 55 of Ta is formed on the gate insulating film 54. The gate insulating film 54 and the gate electrode 55 cover the entire channel region 530 in a length direction of the channel region and slightly overlap the source region 531 and the drain region 532. The source region 531 and the drain region 532 each have a width of 5 nm and, on the SOI layer 53 on both sides thereof, a source electrode 561 and a drain electrode 571 each formed of Mg silicide are provided. A source wiring layer 56 and a drain wiring layer 57 each formed of Cu are respectively connected to the source electrode 561 and the drain electrode 571.

Herein, at least, the surface of the channel region 530 is subjected to a treatment such as natural oxide film removal and then is cleaned in a nitrogen atmosphere (oxygen content 1 ppb or less) in a light-shielded state by using a cleaning solution obtained by adding 30% IPA to hydrogen-added ultrapure water with an oxygen content of 1 ppb or less, and thereafter, the gate insulating film 54 is formed by direct nitriding by nitrogen radicals using a high-density plasma, so that the interface therebetween has a P-V value of 0.16 nm or less. That is, the interface between the channel region 530 and the gate insulating film 54 is extremely flat at the atomic level. The source region 531 and the drain region 532 between the source electrode 561 and the channel region and between the drain electrode 571 and the channel region each have a thickness of 5 nm and their resistances are each 1.0Ω·μm. The Mg silicide of the source and drain electrodes 561 and 571 and the source and drain regions 531 and 532 are in ohmic contact and thus the resistance values are substantially zero, and further, the resistance value of the material is $4.46 \times 10^{-2}$ Ω·μm and thus is negligible as compared with the internal resistance of each of the source and drain regions 531 and 532. After all, the series resistances are each substantially 1.00Ω·μm. The nMOSFET according to the first embodiment of this invention having such a structure can perform the foregoing high-speed operation.

Second Embodiment

Next, referring to FIGS. 15A to 15C, a semiconductor device forming a CMOS circuit including an nMOSFET and a pMOSFET will be described as a second embodiment of this invention.

FIG. 15A is a schematic perspective view of the semiconductor device according to the second embodiment of this invention. FIG. 15B shows a sectional view taken along line A-A' in FIG. 15A and FIG. 15C shows a sectional view taken along line B-B' in FIG. 15A.

The second embodiment is an SOI-type three-dimensional structure CMOS device designed to balance the current driving capabilities with the same size. In this CMOS device, a pMOSFET (p-channel transistor) is fabricated only on the (551) plane where the hole mobility is large and the surface flattening is facilitated, while, an nMOSFET is fabricated on the (551) plane, where the electron mobility is slightly inferior, with its gate formed also at side walls having a plane offset by 4° from the (100) plane where the electron mobility is large and the surface flattening is easy to perform. That is, the n-channel transistor has a three-dimensional structure and the p-channel transistor has a planar structure.

As illustrated in FIGS. 15B and 15C, there is prepared a substrate having predetermined-thickness, (511) surface orientation silicon, i.e. n-type {substrate phosphorus (P) concentration $10^{17}$ cm$^{-3}$} SOI (Silicon on Insulator), layers 14-n and 14-p, separated by a 200 nm-thickness buried oxide film 13, on a support substrate 12.

The surfaces with the (550) surface orientation of the illustrated SOI layers 14-n and 14-p and the side surfaces thereof with a surface orientation offset from the (100) plane by 4° have been subjected to the foregoing flattening process so as to have a (P-V) value of 0.3 nm or less. That is, the SOI layers 14-n and 14-p have been cleaned using the hydrogen-added ultrapure water in the nitrogen atmosphere in the light-shielded state.

Herein, the surface of each of the SOI layers 14-n and 14-p is preferably such that the channel length direction is a <110> direction. This is because the saturation current amount by the movement of holes on the (551) plane becomes maximum in the <110> direction. On the other hand, it is necessary to take into consideration that the crystal-direction dependence of the saturation current amount by the movement of electrons on the (100) plane is small.

In the illustrated example, the SOI layer is removed by etching at its portions other than the region 14-n where the n-channel transistor will be formed and the region 14-p where the p-channel transistor will be formed. As a result, the regions 14-n and 14-p are separately formed on the oxide film 13. The SOI layer may be common to both regions as an i layer or may be formed as a p-type and, later, the region 14-p where the p-channel transistor will be formed may be converted to an n-type. In this event, threshold adjusting impurity implantation may be performed to carry out substrate concentration adjustment. For example, in the 100 nm generation, it is set to $4 \times 10^{18}$ cm$^{-3}$. The side surfaces of the separated regions are the plane offset from the (100) plane by 4°. Among these side surfaces, on the side surfaces excluding the side surfaces of a channel region of the n-channel transistor region 14-n, a thick oxide film 25 is formed by a known method as illustrated in FIG. 15B.

For example, the thick oxide film 25 can be formed by the following technique. At first, after depositing SiO$_2$ to 45 nm or more by CVD, etching is performed using small-damage anisotropic etching while leaving the oxide film on the side walls. Then, masking other than the transistor region 14-n, the thick oxide film on the side surfaces, the side walls, of the channel region of the n-channel transistor region 14-n is removed by wet etching, so that the thick oxide film 25 can be left on the side walls of the transistor region 14-p.

In FIG. 15B, after the formation of the oxide film 25, cleaning is performed and, subsequently, gate insulating film formation is performed using a microwave-excited plasma apparatus, thereby forming a 2 nm Si$_3$N$_4$ film 15 on the upper surface and the side surfaces of the channel region of the n-channel transistor region 14-n and on the upper surface of the channel region of the p-channel transistor region 14-p. In this event, the film may be formed to a thickness for obtaining a desired capacitance. As the gate insulating film 15, use may be made of a high permittivity material, such as a metal oxide such as SiO$_2$, HfO$_x$, ZrO$_x$, or La$_2$O$_3$, or a metal nitride such as Pr$_x$Si$_y$N$_z$.

Thereafter, a Ta film is formed and then etched to a desired gate length and width, thereby forming gate electrodes 16. Thereafter, $4 \times 10^{15}$ cm$^{-2}$ of arsenic is ion-implanted into source and drain layers 17 of the nMOSFET region and $4 \times 10^{15}$ cm$^{-2}$ of boron is ion-implanted into source and drain layers 18 of the pMOSFET region, thereby performing activation.

Further, a SiO$_2$ film is formed by CVD and, as shown in FIG. 15C, a gate line 19, an output line 20, drain electrodes 21, and source electrodes 22 are formed as wiring layers. In this case, the drain electrodes 21 and the source electrodes 22 are also buried in the drain regions and the source regions, respectively, so that the resistance from each electrode to the channel region becomes 1.5 Ω·μm or less. Herein, electrode materials are selected so that the contact resistance Rc between each electrode and the silicon becomes $10^{-11}$ Ωcm$^2$ or less. That is, the electrodes connected to the n$^+$ silicon regions of the nMOSFET are formed of a material selected from Mg, Mn, Cd, Hf, Y, and Zr (Mg in this embodiment). On the other hand, the electrodes connected to the p$^+$ silicon regions of the pMOSFET are formed of a material selected from Co, Ni, Pd, and Ir (Ir in this embodiment). By this, the work function difference between each electrode and the silicon region can be set to 0.2 eV or less. As a result, the effective transconductance can be increased in each of the nMOSFET and the pMOSFET. In the illustrated example, each of the selected electrode materials forms a silicide between itself and the silicon region.

Further, in the illustrated example, an inversion-mode pMOSFET 100p and an inversion-mode nMOSFET 100n are formed on the same substrate. In this case, the total area of the upper surface and the side surfaces of the channel region of the n-channel transistor region 14-n and the area of the upper surface of the channel region of the p-channel transistor region 14-p are equal to each other and the operating speeds of both transistors are also equal to each other.

Next, the conditions for obtaining such transistors will be described. The lengths L of the channel regions of both transistors 100p and 100n are set equal to each other, the width of the upper surface of the channel region of the n-channel transistor region 14-n is given by Wn, the height of the side surface thereof is given by H, and the width of the upper surface of the channel region of the p-channel transistor region 14-p is given by Wp. In this case, a later-described formula (5) should be established.

A later-described formula (6) should be established in order for the operating speeds of both transistors to be equal to each other. Herein, given that transconductances on the (100) 4° offset plane and (551) planes of the nMOSFET are gmn(100) and gmn(551), respectively, and a transconductance on the (511) plane of the p-channel transistor is gmp (551), the transconductances gmn(100), gmn(551), and gmp (551) are all known. Further, if, for example, the width Wn is set to a proper value, the required height H and width Wp are obtained as solutions of simultaneous equations of the formula (5) and the formula (6).

Under such conditions, if, for example, the width Wn is set to 22 nm, gmn(551) is set to about 0.7 gmn(100), and gmp (551) is set to 0.8 gmn(100), the height H is 5.5 nm and the width Wp is 33 nm. In the illustrated embodiment, the channel lengths of both transistors are each set to 25 nm.

$$Wp = 2H + Wn \quad (5)$$

$$gmp(110) \times Wp = gmn(100) \times 2H + gmp(110) \times Wn \quad (6)$$

With this configuration, the channel areas and the gate areas of the nMOSFET 100n and the pMOSFET 100p can be made substantially equal to each other and, therefore, the current driving capabilities of both transistors and thus the operating speeds thereof can be made substantially equal to each other, so that a fully balanced CMOS can be obtained. Further, by equalizing the gate areas of both transistors, the gate capacitances of both transistors become equal to each other, so that the offset noise of an analog switch formed by these transistors can be reduced by as much as 15 dB. In the embodiment illustrated in FIG. 15C, the pMOSFET and the nMOSFET are each in the form of the inversion-mode transistor.

Figure 16A:
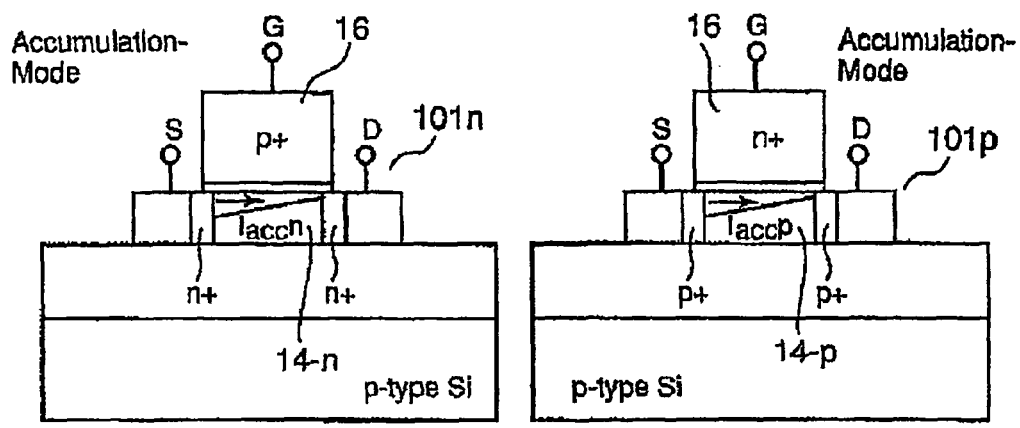
FIG. 16A is a diagram illustrating the structure of a CMOS circuit according to another embodiment of this invention.
Figure 16B:
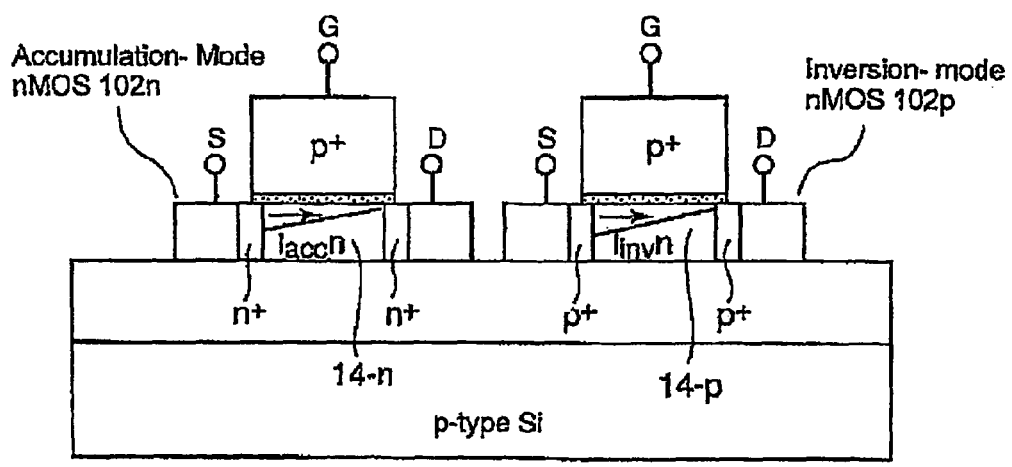
FIG. 16B is a diagram illustrating the structure of a CMOS circuit according to still another embodiment of this invention.
Figure 16C:
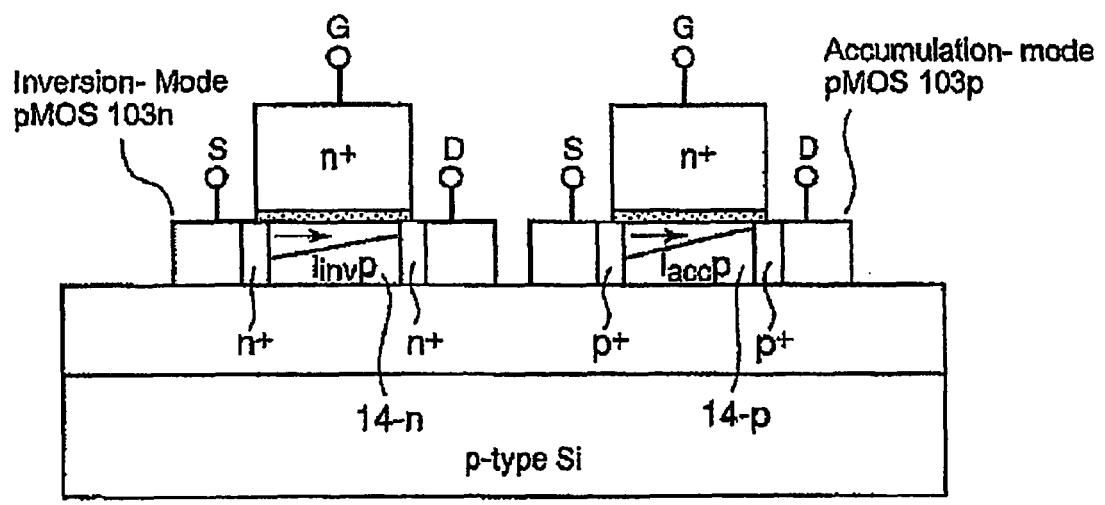
FIG. 16C is a diagram illustrating the structure of a CMOS circuit according to yet still another embodiment of this invention.

FIGS. 16A to 16C illustrate three embodiments other than the embodiment illustrated in FIG. 15C and are sectional views in the direction corresponding to FIG. 15C. In each embodiment, the surfaces and the side surfaces of the SOI layers have been subjected to the flattening process so as to have a (P-V) value of 0.3 nm or less. Further, electrode materials and electrode structures of drain and source electrodes are selected so that the contact resistance Rc becomes $10^{-10}$ Ωcm$^2$ or less as described with reference to FIG. 11.

FIG. 16A is an example in which an n-channel transistor (i.e. nMOSFET) 101n and a p-channel transistor (i.e. pMOSFET) 101p are each of the accumulation mode. FIG. 16B is an example in which an n-channel transistor (i.e. nMOSFET) 102n is of the accumulation mode and a p-channel transistor (pMOSFET) 102p is of the inversion mode. Since the structure of FIG. 16B is formed by wells (n-wells) of the same conductivity type and gate electrodes of the same conductivity type (p$^+$-type), there is an advantage in that the process is simplified. Further, using the accumulation-mode n-channel transistor, the 1/f noise of the entire CMOS can be reduced. FIG. 16C is an example in which an n-channel transistor (nMOSFET) 103n is of the inversion mode and a p-channel transistor (pMOSFET) 103p is of the accumulation mode. Since this example is formed by wells (p-wells) of the same conductivity type and gate electrodes of the same conductivity type (n$^+$-type), there is an advantage in that the process is simplified. Further, since only the n$^+$-type polysilicon gate electrodes are used, it is possible to prevent diffusion of boron caused by film thickness reduction (boron tends to diffuse into a gate oxide film and thus there occurs a phenomenon that the interface mobility of carriers is degraded). Further, there is also an advantage in that, using the accumulation-mode transistor, the current driving capability can be increased as compared with the inversion-mode transistor. Further, in the case of the accumulation-mode transistor, by selecting a work function difference between a gate electrode and a semiconductor layer of a channel region, the thickness of a depletion layer formed in the channel region can be greater than that of the semiconductor layer of the channel region.

In the embodiments, the description has been given of the case where the surface of each transistor region is the (511) plane and the side surfaces thereof are the (100) 4° offset plane. However, this invention is by no means limited thereto. The surface may be a plane within ±10° from the (110) plane and the side surfaces may be a plane within ±10° from the (100) plane. This invention is equally applicable to the case where the surface is the (100) plane or a plane within ±10° from the (100) plane and the side surfaces are the (110) plane or a plane within ±10° from the (110) plane.

INDUSTRIAL APPLICABILITY

While the description has been given of transistors alone in the form of nMOSFET and pMOSFET, and CMOS circuits formed by these transistors, this invention is not limited thereto, but is also applicable to various elements and electronic circuits.

The invention claimed is:

1. A semiconductor device comprising a channel region, a source region formed at one of both sides of said channel region, a drain region formed at another one of the both sides of said channel region, said semiconductor device further comprising a first electrode electrically connected to one of said source and said drain regions or two first electrodes electrically connected to said source and said drain regions, respectively, and a second electrode formed on said channel region through a gate insulating film, wherein
    the interface between said channel region and said gate insulating film is made flat at the atomic level, and
    at least a contact portion of said first electrode which is connected to said source region or drain region is formed of a metal silicide and a metal forming said metal silicide is selected such that a work function difference between said metal silicide and said source region or drain region which is connected to said metal silicide becomes 0.32 eV or less.

2. A semiconductor device according to claim 1, wherein said resistance includes a contact resistance of a contact portion where said first electrode is in contact with said at least one of said source region and said drain region, and an internal series resistance of said at least one of said source region and said drain region from said contact portion to said channel region, and said contact resistance is $1 \times 10^{-10}$ Ωcm$^2$ or less.

3. A semiconductor device according to claim 1, wherein said source region and said drain region are formed of a metal or a metal-semiconductor compound having a work function with a difference of 0.32 eV or less with respect to a work function of a semiconductor of said channel region.

4. A semiconductor device according to claim 1, wherein said channel region is formed of n-type silicon and said source region and said drain region are formed of a metal or a metal silicide having a work function of −4.37 eV or more.

5. A semiconductor device according to claim 1, wherein said channel region is formed of p-type silicon and said source region and said drain region are formed of a metal or a metal silicide having a work function of −4.85 eV or less.

6. A semiconductor device according to claim 1, wherein said semiconductor device is normally off and is of an inversion mode or an accumulation mode.

7. A semiconductor device according to claim 1, wherein said semiconductor device is an accumulation-mode transistor.

8. A semiconductor device according to claim 1, wherein a gate insulating film on said channel region contains at least one kind of $SiO_2$, $Si_3N_4$, a metal silicon alloy oxide film, and a metal silicon alloy nitride film formed by a microwave-excited plasma.

9. A CMOS semiconductor device comprising at least a pair of n-channel transistor and a p-channel transistor, wherein
said n-channel transistor and said p-channel transistor are implemented by the semiconductor device according to claim 1,
at least contact portions of said first electrodes respectively contacting the source and the drain regions of said n-channel transistor are formed of a first metal silicide, and
at least contact portions of said second electrodes respectively contacting the source and the drain regions of said p-channel transistor are formed of a second metal silicide different from said first metal silicide.

10. A CMOS semiconductor device according to claim 9, wherein said first metal silicide is formed of a material that has a work function of −4.37 eV or more and said second metal silicide is formed of a material that has a work function of −4.85 eV or less.

11. A semiconductor device according to claim 1, wherein said channel region, said source region, and said drain region are formed to a silicon layer, a surface of said channel region in said silicon layer has a (110) plane or a plane within ±10° from the (110) plane.

12. A semiconductor device according to claim 11, wherein a surface of said channel region is a (551) plane.

13. A semiconductor device comprising a channel region, a source region formed at one of both sides of said channel region, a drain region formed at another one of the both sides of said channel region, said semiconductor device further comprising a first electrode electrically connected to one of said source and said drain regions or two first electrodes electrically connected to said source and said drain regions, respectively, and a second electrode formed on said channel region through a gate insulating film, wherein
the interface between said channel region and said gate insulating film has a flatness degree such that a peak-to-valley over a length of 2 nm in a direction from said source region to said drain region is 0.3 nm or less, and
at least a contact portion of said first electrode which is connected to said source region or drain region is formed of a metal silicide and a metal forming said metal silicide is selected such that a work function difference between said metal silicide and said source region or drain region which is connected to said metal silicide becomes 0.32 eV or less.

14. A semiconductor device comprising a circuit having at least a pair of transistors of different conductivity types, wherein said semiconductor device further comprises an n-channel transistor having a first semiconductor layer and a first gate insulating layer covering at least a part of a surface of said first semiconductor layer and a p-channel transistor having a second semiconductor layer and a second gate insulating layer covering at least a part of a surface of said second semiconductor layer,
wherein a surface of a first region, adapted to form a channel, of said first semiconductor layer has at least one of a (100) plane or a plane within ±10° from the (100) plane and a (110) plane or a plane within ±10° from the (110) plane,
a surface of a second region, adapted to form a channel, of said second semiconductor layer has at least one of a (110) plane or a plane within ±10° from the (110) plane and a (100) plane or a plane within ±10° from the (100) plane,
a source region and a drain region and further a source electrode and a drain electrode are provided at both ends of each of said first region and said second region, and
a resistance from each of said first and second regions to each of said source electrode and said drain electrode provided at both ends of the corresponding region is set to 4 Ω·μm or less,
wherein the interfaces between said first region and said first gate insulating layer and between said second region and said second gate insulating layer have a flatness degree such that a peak-to-valley over a length of 2 nm in a direction from a source to a drain of the corresponding region is 0.3 nm or less, and
wherein said source region and said drain region at both ends of said first region are formed of a first metal or metal silicide having a work function of −4.37 eV or more and shared by at least a part of said source electrode and at least a part of said drain electrode, respectively, and said source region and said drain region at both ends of said second region are formed of a second metal or metal silicide having a work function of −4.85 eV or less and shared by at least a part of said source electrode and at least a part of said drain electrode, respectively.

15. A semiconductor device according to claim 14, wherein at least contact portions, respectively contacting said source region and said drain region, of said source electrode and said drain electrode at both ends of said first region are formed of a first metal silicide and at least contact portions, respectively contacting said source region and said drain region, of said source electrode and said drain electrode at both ends of said second region are formed of a second metal silicide different from said first metal silicide.

16. A semiconductor device according to claim 15, wherein said first metal silicide is formed of a material that has a work function thereof to be −4.37 eV or more and said second metal silicide is formed of a material that has a work function thereof to be −4.85 eV or less.

17. A semiconductor device according to claim 14, wherein said n-channel transistor and said p-channel transistor are each normally off, one of said n-channel transistor and said p-channel transistor is of one of an inversion mode and an accumulation mode, and the other is of said one or the other of the inversion mode and the accumulation mode.

18. A semiconductor device according to claim 17, wherein a channel region of said accumulation-mode transistor is formed by an SOI layer and a thickness of said SOI layer is set smaller than that of a depletion layer in the vicinity of a source region of said channel region.

19. A semiconductor device according to claim 18, wherein the thickness of said SOI layer, an impurity concentration in said SOI layer, and a work function of a gate electrode over said channel region are determined so that an end portion on a source region side of said channel region is filled with the depletion layer when a gate voltage is equal to a source voltage in said accumulation-mode transistor.

20. A semiconductor device comprising a circuit having at least a pair of transistors of different conductivity types, wherein said semiconductor device further comprises an n-channel transistor having a first semiconductor layer and a first gate insulating layer covering at least a part of a surface of said first semiconductor layer and a p-channel transistor having a second semiconductor layer and a second gate insulating layer covering at least a part of a surface of said second semiconductor layer, wherein a surface of a first region, adapted to form a channel, of said first semiconductor layer has at least one of a (100) plane or a plane within ±10° from the (100) plane and a (110) plane or a plane within ±10° from the (110) plane, a surface of a second region, adapted to form a channel, of said second semiconductor layer has at least one of a (110) plane or a plane within ±10° from the (110) plane and a (100) plane or a plane within ±10° from the (100) plane, a source region and a drain region and further a source electrode and a drain electrode are provided at both ends of each of said first region and said second region, and a resistance from each of said first and second regions to each of said source electrode and said drain electrode provided at both ends of the corresponding region is set to 4 Ω·μm or less, and wherein the interfaces between said first region and said first gate insulating layer and between said second region and said second gate insulating layer have a flatness degree such that a peak-to-valley over a length of 2 nm in a direction from a source to a drain of the corresponding region is 0.3 nm or less, wherein an upper surface of said first region of said first semiconductor layer and an upper surface of said second region of said second semiconductor layer are each formed by a (110) plane or a plane within ±10° from the (110) plane, a third region adapted to form a channel is provided on one side or both sides of said first semiconductor layer, a surface of said third region has a (100) plane or a plane within ±10° from the (100) plane, and a width and a length of the upper surface of said first region, a width and a length of the upper surface of said second region, and a height and a length of the surface of said third region are determined so that the sum of an area of the upper surface of said first region and an area of the surface of said third region is substantially equal or equivalent to an area of the upper surface of said second region and, further, operating speeds of said n-channel transistor and said p-channel transistor are substantially equal or equivalent to each other.

* * * * *